US012796095B2

(12) United States Patent
Kwon et al.

(10) Patent No.: US 12,796,095 B2
(45) Date of Patent: Nov. 10, 2026

(54) DISPLAY APPARATUS

(71) Applicant: Samsung Display Co., Ltd., Yongin-Si (KR)

(72) Inventors: Semyung Kwon, Yongin-si (KR); Sungho Kim, Yongin-si (KR); Injun Bae, Yongin-si (KR); Sugwoo Jung, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 378 days.

(21) Appl. No.: 18/509,356

(22) Filed: Nov. 15, 2023

(65) Prior Publication Data

US 2024/0321909 A1 Sep. 26, 2024

(30) Foreign Application Priority Data

Mar. 20, 2023 (KR) ........................ 10-2023-0036159

(51) Int. Cl.

*H10D 86/60* (2025.01)
*G09G 3/32* (2016.01)
*H10D 86/40* (2025.01)

(52) U.S. Cl.

CPC ............... *H10D 86/60* (2025.01); *G09G 3/32* (2013.01); *H10D 86/423* (2025.01); (Continued)

(58) Field of Classification Search

CPC .... H10D 86/60; H10D 86/423; H10D 86/441; H10D 86/451; H10D 30/6755; (Continued)

(56) References Cited

U.S. PATENT DOCUMENTS 9,818,765 B2 11/2017 Osawa et al.
10,541,336 B2 1/2020 Lim et al.
(Continued)

FOREIGN PATENT DOCUMENTS

KR 10-2018-0009820 A 1/2018
KR 10-2018-0099974 A 9/2018
(Continued)

*Primary Examiner* — Sitaramarao S Yechuri
(74) *Attorney, Agent, or Firm* — Innovation Counsel LLP

(57) ABSTRACT

A display apparatus includes a substrate having a display area and a peripheral area outside the display area, a transistor in the display area and a light-emitting element electrically connected to the transistor, and a scan driver in the peripheral area, wherein the scan driver includes a first transistor disposed on the substrate and including a first semiconductor layer comprising an oxide semiconductor and a first gate electrode overlapping the first semiconductor layer, a second transistor disposed on the substrate and including a second semiconductor layer comprising a silicon semiconductor and a second gate electrode overlapping the second semiconductor layer, and insulating layers disposed on the substrate and defining dummy holes not overlapping the first semiconductor layer and the second semiconductor layer, wherein the dummy holes are spaced apart from the first semiconductor layer and the second semiconductor layer and overlap dummy semiconductor layers adjacent to the first semiconductor layer.

20 Claims, 27 Drawing Sheets

(52) U.S. Cl.
CPC ......... *H10D 86/441* (2025.01); *H10D 86/451* (2025.01); *G09G 2300/0819* (2013.01); *G09G 2300/0842* (2013.01); *G09G 2300/0861* (2013.01); *G09G 2310/0267* (2013.01); *G09G 2310/08* (2013.01)

(58) Field of Classification Search
CPC ... G09G 2300/0819; G09G 2300/0842; G09G 2300/0861; G09G 2300/0426; G09G 2310/0267; G09G 2310/08; G09G 3/32; G09G 3/3233; G09G 3/3266; H10K 59/1213; H10K 59/123; H10K 59/124; H10K 59/131
See application file for complete search history.

(56) References Cited

U.S. PATENT DOCUMENTS

| | | | | |
|---|---|---|---|---|
| 10,622,430 | B2 | 4/2020 | Jeong et al. | |
| 10,998,393 | B2 | 5/2021 | Jeong et al. | |
| 2010/0176395 | A1* | 7/2010 | Choi | H10D 88/00 257/E29.1 |
| 2018/0190204 | A1* | 7/2018 | Shin | G09G 3/3677 |
| 2019/0229160 | A1* | 7/2019 | Lee | H10K 59/131 |
| 2023/0274687 | A1 | 8/2023 | In | |
| 2023/0298529 | A1 | 9/2023 | In | |

FOREIGN PATENT DOCUMENTS

| | | | |
|---|---|---|---|
| KR | 10-2019-0085175 | A | 7/2019 |
| KR | 10-2023-0128209 | A | 9/2023 |
| KR | 10-2023-0129108 | A | 9/2023 |

* cited by examiner

DISPLAY APPARATUS

CROSS-REFERENCE TO RELATED APPLICATION

This application is based on and claims priority under 35 U.S.C. § 119 to Korean Patent Application No. 10-2023-0036159, filed on Mar. 20, 2023, in the Korean Intellectual Property Office, the disclosure of which is incorporated by reference herein in its entirety.

BACKGROUND

1. Field

The present disclosure relates to a display apparatus, and more particularly, to a display apparatus capable of displaying high-quality images.

2. Description of the Related Art

Generally, in a display apparatus such as an organic light-emitting display apparatus, thin-film transistors, connection electrodes, and wires are arranged in each (sub)pixel to control the brightness or the like of each (sub)pixel in a display area. Also, a scan driver is positioned in a peripheral area outside the display area, and a scan signal from the scan driver is transferred to (sub)pixels through scan lines.

However, in a display apparatus in the related art, a scan signal may not be accurately generated.

SUMMARY

One or more embodiments include a display apparatus capable of displaying high-quality images. However, the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate having a display area and a peripheral area outside the display area, a transistor in the display area and a light-emitting element electrically connected to the transistor, and a scan driver in the peripheral area, wherein the scan driver includes a first transistor disposed on the substrate and including a first semiconductor layer comprising an oxide semiconductor and a first gate electrode overlapping the first semiconductor layer, a second transistor disposed on the substrate and including a second semiconductor layer comprising a silicon semiconductor and a second gate electrode overlapping the second semiconductor layer, and insulating layers disposed on the substrate and defining dummy holes not overlapping the first semiconductor layer and the second semiconductor layer, wherein the dummy holes are spaced apart from the first semiconductor layer and the second semiconductor layer and overlap dummy semiconductor layers adjacent to the first semiconductor layer.

In an embodiment, in a plan view, a shortest distance between the dummy holes and the first semiconductor layer may be 10 μm or less.

In an embodiment, in a plan view, the first semiconductor layer may include through holes, and the dummy semiconductor layers may be respectively in the through holes of the first semiconductor layer.

In an embodiment, the dummy semiconductor layers may be disposed on a same layer as the second semiconductor layer and include a same material as a material of the second semiconductor layer.

In an embodiment, the insulating layers may include a first insulating layer covering the second semiconductor layer and a second insulating layer disposed on the first insulating layer and covering the first semiconductor layer, and the dummy holes may penetrate the first insulating layer and the second insulating layer.

In an embodiment, the dummy holes may include a first dummy hole filled with a conductive material and a second dummy hole filled with an insulating material.

In an embodiment, the first gate electrode may include branch electrodes extending in a first direction and electrically connected to each other, and the branch electrodes may be between the through holes of the first semiconductor layer.

In an embodiment, a gap between the branch electrodes may be constant.

In an embodiment, widths of the branch electrodes in a second direction perpendicular to the first direction may be equal to each other.

In an embodiment, the display apparatus may further include, in a plan view, first branch electrodes positioned between the branch electrodes and electrically connected to each other, and second branch electrodes positioned between the branch electrodes to be spaced apart from the first branch electrodes and electrically connected to each other.

In an embodiment, each of the first branch electrodes may be in contact with the first semiconductor layer through a first contact hole, and each of the second branch electrodes may be in contact with the first semiconductor layer through a second contact hole.

In an embodiment, the first branch electrodes may overlap some of the dummy holes, and the second branch electrodes may overlap some other of the dummy holes.

In an embodiment, a plurality of first contact holes and a plurality of second contact holes may be provided, in a plan view, the dummy holes overlapping any one of the first branch electrodes and the plurality of first contact holes may be arranged in a direction in which the one first branch electrode extends, and the dummy holes overlapping any one of the second branch electrodes and the plurality of second contact holes may be arranged in a direction in which the one second branch electrode extends.

In an embodiment, in a plan view, the dummy holes overlapping any one of the first branch electrodes and the plurality of first contact holes may be alternately arranged, and the dummy holes overlapping any one of the second branch electrodes and the plurality of second contact holes may be alternately arranged.

In an embodiment, a vertical distance between a lower end of each of the dummy holes and the substrate may be less than a vertical distance between a lower end of the first contact hole and the substrate or a vertical distance between a lower end of the second contact hole and the substrate.

In an embodiment, in a plan view, the second semiconductor layer may at least partially overlap the first semiconductor layer.

In an embodiment, one of the first branch electrodes and the second branch electrodes may be in contact with the second semiconductor layer through at least one third contact hole.

In an embodiment, in a plan view, the first semiconductor layer may include outer concave portions, and the at least one third contact hole may be in the outer concave portions of the first semiconductor layer.

In an embodiment, in a plan view, a shortest distance between the at least one third contact hole and the first semiconductor layer may ne 10 μm or less.

In an embodiment, the scan driver may include a plurality of stages and has an output terminal electrically corresponding to a scan line corresponding to each of the plurality of stages, and the first transistor of the scan driver may be electrically connected to the output terminal.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
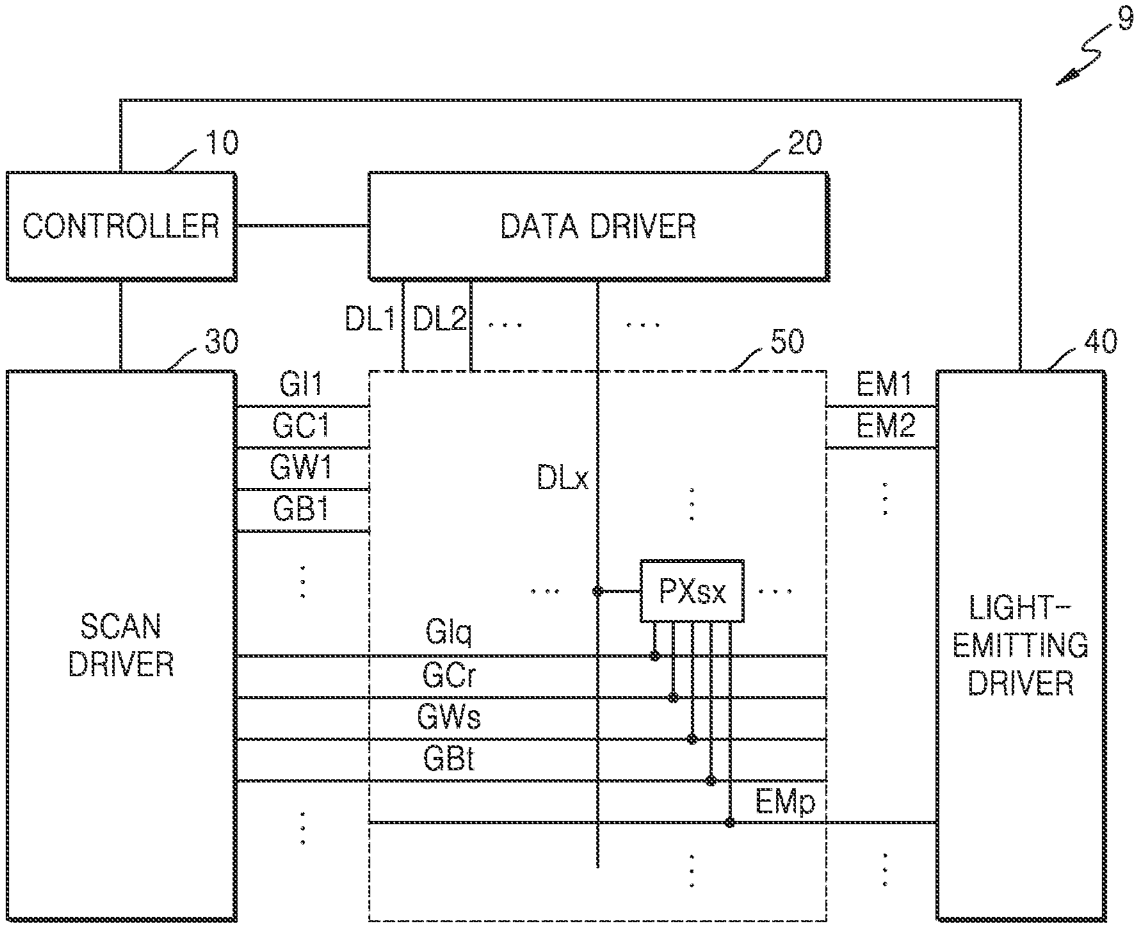
FIG. 1 is a conceptual diagram for explaining a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various changes and numerous embodiments, particular embodiments will be illustrated in the drawings and described in detail in the written description. Effects and features of the disclosure and methods of achieving the same will be apparent with reference to embodiments and drawings described below in detail. The disclosure may, however, be embodied in many different forms and should not be construed as being limited to the embodiments set forth herein.

In the following embodiments, while such terms as "first," "second," etc., may be used to describe various elements, such elements must not be limited to the above terms.

In the following embodiments, an expression used in the singular encompasses the expression of the plural, unless it has a clearly different meaning in the context.

In the following embodiments, it is to be understood that the terms such as "including." "having," and "comprising" are intended to indicate the existence of the features, or elements disclosed in the present disclosure, and are not intended to preclude the possibility that one or more other features or elements may exist or may be added.

It will be understood that when a layer, region, or component is referred to as being formed on another layer, region, or component, it can be directly or indirectly formed on the other layer, region, or component. That is, for example, intervening layers, regions, or components may be present.

As used herein, the word "or" means logical "or" so that, unless the context indicates otherwise, the expression "A, B, or C" means "A and B and C," "A and B but not C," "A and C but not B," "B and C but not A," "A but not B and not C," "B but not A and not C," and "C but not A and not B." In addition, in the present disclosure, "at least one of A and B" may include "A," "B," or "A and B."

In the following disclosure, it will be understood that when a wire is referred to as "extending in a first direction or a second direction", it can not only extend in a linear shape, but also can extend in the first direction or the second direction in a zigzag or curved shape.

In the following embodiment, a "plan view" indicates that a portion of a target object is seen from above, and a "cross-sectional view" indicates that a portion of a target object is vertically cut and the cross-section is viewed from the side. In the following embodiment, a term "overlapping" includes overlapping in a plan view and a cross-sectional view.

The disclosure will now be described more fully with reference to the accompanying drawings, in which embodiments of the disclosure are shown. Like reference numerals in the drawings denote like elements.

FIG. 1 is a conceptual diagram for explaining a display apparatus 9 according to an embodiment.

As shown in FIG. 1, the display apparatus 9 according to an embodiment may include a controller 10, a data driver 20, a scan driver 30, a light-emitting driver 40, and a display area 50.

The controller 10 may receive external input signals from an external processor. The external input signals may include a horizontal synchronization signal, a vertical synchronization signal, a data enable signal, RGB data signals, or the like.

The vertical synchronization signal may include a plurality of pulses. It may be considered that a previous frame period ends and a current frame period starts based on a time point at which the plurality of pulses of the vertical synchronization signal are generated. Accordingly, an interval between adjacent pulses of the vertical synchronization signal may correspond to one frame period. The horizontal synchronization signal may also include a plurality of pulses. It may be considered that a previous horizontal period ends and a new horizontal period starts based on a time point at which the plurality of pulses of the horizontal synchronization signal are generated. Accordingly, an interval between adjacent pulses of the horizontal synchronization signal may correspond to one horizontal period.

A data enable signal may be maintained at an enable level during specific horizontal periods and maintained at a disable level during remaining periods. During horizontal periods in which the data enable signal is at an enable level, an RGB signal may be supplied. The RGB data signal may be supplied in units of rows of pixels in a display area during horizontal periods. For reference, pixels connected to the same scan line may be referred to as pixels positioned in the same row. The controller 10 may generate grayscale values based on an RGB data signal to correspond to the specification of the display apparatus 9. The controller 10 may generate control signals to be supplied to the data driver 20, the scan driver 30, the light-emitting driver 40, or the like, based on an external input signal to correspond to the specification of the display apparatus 9.

The data driver 20 may generate data signals to be provided to data lines DL1, DL2, . . . , DLx, . . . by using grayscale values and control signals received from the controller 10. For example, the data driver 20 may sample the grayscale values by using a clock signal, and may supply data signals corresponding to the grayscale values to the data lines DL1, DL2, . . . , DLx, . . . in units of rows of pixels in the display area. Here, x may be a natural number.

The scan driver 30 may receive a clock signal, a scan signal, or the like from the controller 10 to generate scan signals to be provided to scan lines GI1, GC1, GW1, GB1, . . . , GIq, GCr, GWs, GBt, . . . . Here, q, r, s, and t may be natural numbers.

The scan driver 30 may include a plurality of sub scan drivers. For example, a first sub scan driver may generate scan signals provided to first scan lines GI1, . . . , GIq, . . . . A second sub scan driver may generate scan signals provided to second scan lines GC1, . . . , GCr, . . . . A third sub scan driver may generate scan signals provided to third scan lines GW1, . . . , GWs, . . . . A fourth scan driver may generate scan signals provided to fourth scan lines GB1, . . . , GBt, . . . . Each of the sub scan drivers may include a plurality of stages connected in a form of a shift register. For example, scan signals may be generated in a method of sequentially transferring turn-on level pulses of a scan start signal supplied to a scan start line to a next scan stage. In some cases, some sub scan drivers may be integrated.

The light-emitting driver 40 may generate emission signals to be provided to emission lines EM1, EM2, . . . , EMp, . . . by receiving a clock signal, a light-emitting stop signal, or the like from the controller 10. Here, p may be a natural number. For example, the light-emitting driver 40 may sequentially provide emission signals having turn-off level pulses to the emission lines EM1, EM2, . . . , EMp, . . . . For example, the light-emitting driver 40 may be configured in a form of a shift register, and may generate emission signals in a method of sequentially transferring turn-off level pulse of a light-emitting stop signal to a next light-emitting stage under the control of a clock signal.

A substrate may have a display area 50 and a peripheral area outside the display area 50, and the controller 10, the data driver 20, the scan driver 30, and the light-emitting driver 40 may be positioned in the peripheral area outside the display area 50.

The display area 50 may include pixels PXsx. Each of the pixels PXsx may include a pixel circuit including a thin-film transistor and a display element electrically connected to the pixel circuit. The pixel PXsx may be electrically connected to a corresponding data line DLx, corresponding scan lines GIq, GCr, GWs, and GBt, and a corresponding emission line EMp.

Figure 2:
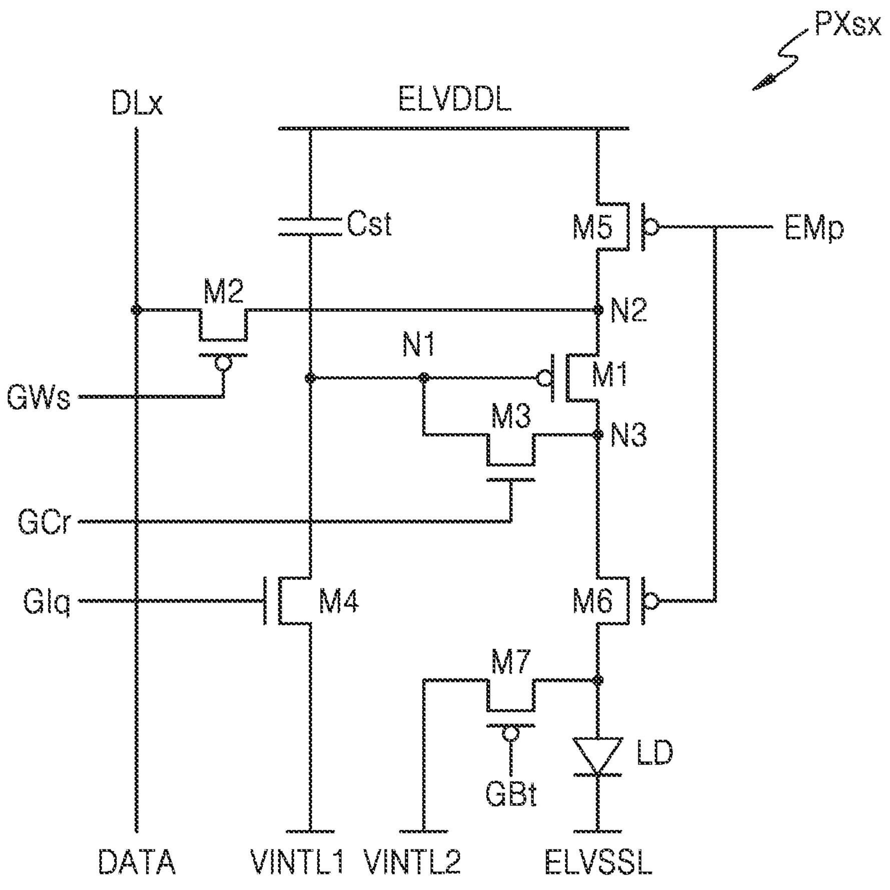
FIG. 2 is an equivalent circuit diagram illustrating a display element and a pixel circuit connected to the display element included in the display apparatus of FIG. 1.

FIG. 2 is an equivalent circuit diagram illustrating a pixel PXsx that includes a display element and a pixel circuit connected to the display element included in the display apparatus of FIG. 1. As shown in FIG. 2, the pixel PXsx according to the embodiment may include a light-emitting element LD as a display element, a pixel circuit connected to the light-emitting element LD may include transistors M1, M2, M3, M4, M5, M6, and M7 and a capacitor Cst. The transistors M1, M2, M3, M4, M5, M6, and M7 may be thin-film transistors.

A gate electrode of the transistor M1 may be connected to a node N1, a first electrode thereof may be connected to a node N2, and a second electrode thereof may be connected to a node N3. The first electrode may be any one of a source electrode and a drain electrode, and the second electrode may be the other one. Because the transistor M1 may control an amount of current flowing through the light-emitting element LD, the transistor M1 may be a driving transistor.

A gate electrode of the transistor M2 may be connected to a third scan line GWs to receive one of third scan signals, a first electrode thereof may be connected to a data line DLx, and a second electrode thereof may be connected to the node N2. Because the transistor M2 receives a data signal DATA from the data line DLx when turned on, the transistor M2 may be a scan transistor.

A gate electrode of the transistor M3 may be connected to a second scan line GCr to receive one of second scan signals, a first electrode thereof may be connected to the node N1, and a second electrode thereof may be connected to the node N3. Because the transistor M3 functions to compensate a threshold voltage by diode-connecting the transistor M1, the transistor M3 may be a compensation transistor.

A gate electrode of the transistor M4 may be connected to a first scan line GLq to receive one of first scan signals, a first electrode thereof may be connected to the node N1, and a second electrode thereof may be connected to a first initialization line VINTL1. Because the transistor M4 functions to initialize a potential of the node N1 connected to the gate electrode of the transistor M1, which is the driving transistor, the transistor M4 may be a gate initialization transistor.

A gate electrode of the transistor M5 may be connected to an emission line EMp to receive one of emission signals, a first electrode thereof may be connected to a first power line ELVDDL, and a second electrode thereof may be connected to the node N2. Because when the transistor M5 is turned on, first power is supplied to the transistor M1, which is the driving transistor, and the light-emitting element LD emits light, the transistor M5 may be a first emission transistor.

A gate electrode of the transistor M6 may also be connected to the emission line EMp to receive one of emission signals. A first electrode of the transistor M6 may be connected to the node N3, and a second electrode thereof may be electrically connected to the light-emitting element LD. Because when the transistor M6 is turned on, a current controlled by the transistor M1, which is the driving transistor, flows to the light-emitting element LD, and the light-emitting element LD emits light, the transistor M6 may be a second emission transistor.

A gate electrode of the transistor M7 may be connected to a fourth scan line GBt to receive one of fourth scan signals, a first electrode thereof may be connected to a second initialization line VINTL2, and a second electrode thereof may be electrically connected to the light-emitting element LD. Because when the transistor M7 is turned on, a potential of an anode of the light-emitting element LD is initialized, the transistor M7 may be an anode initialization transistor. In some cases, the gate electrode of the transistor M7 may also be connected to the third scan line GWs.

The capacitor Cst may include a first electrode and a second electrode, the first electrode may be connected to the first power line ELVDDL, and the second electrode may be connected to the node N1.

In the light-emitting element LD, a first electrode thereof (e.g., an anode) may be connected to the second electrode of the transistor M6 and the second electrode of the transistor M7, and a second electrode thereof (e.g., a cathode) may be connected to a second power line ELVSSL. During an emission period of the light-emitting element LD, a voltage applied to the second power line ELVSSL may be set to be less than a voltage applied to the first power line ELVDDL. The light-emitting element LD may be an organic light-emitting diode or an inorganic light-emitting diode. FIG. 2 illustrates that the pixel PXsx includes one light-emitting element LD, but this is an example, and when necessary, the pixel PXsx may include a plurality of light-emitting elements connected in series, in parallel, or in series and parallel.

The transistors M1, M2, M5, M6, and M7 are p-type transistors, and each of which may include a semiconductor layer including polysilicon. Polysilicon has high electron mobility, and thus, a transistor including polysilicon may have fast driving characteristics.

The transistors M3 and M4 are n-type transistor, and each of which may include a semiconductor layer including an oxide semiconductor. The oxide semiconductor has lower charge mobility than that of polysilicon. Accordingly, an amount of leakage current in a turn-off state of a transistor include an oxide semiconductor may be less than that of a transistor including polysilicon.

Figure 3:
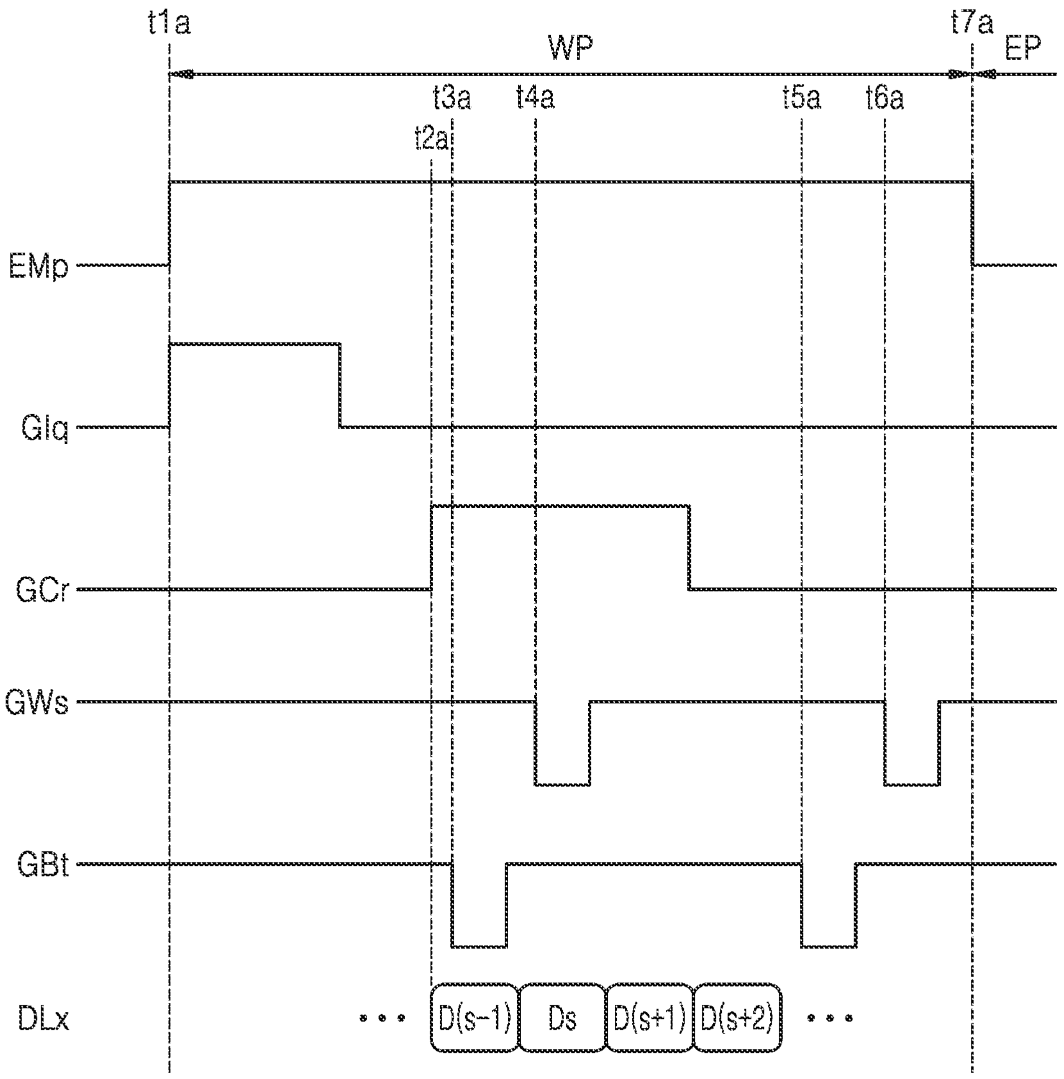
FIG. 3 is a waveform diagram for explaining a data write period of a display apparatus according to an embodiment.

FIG. 3 is a waveform diagram for explaining a data write period of a display apparatus according to an embodiment.

At a time point t1*a*, an emission signal at a turn-off level (e.g., high level) may be applied to the emission line EMp. Accordingly, the transistors M5 and M6 are turned off, and the light-emitting element LD may be in a non-emission state. Also, at the time point t1*a*, a first scan signal at a turn-on level (e.g., high level) may be applied to the first scan line GIq. Accordingly, the transistor M4 is turned on, the node N1 is electrically connected to the first initialization line VINTL1, and the node N1 may be initialized with a first initialization voltage of the first initialization line VINTL1. The first initialization voltage may be a voltage sufficiently lower than a voltage of the node N2. Accordingly, the transistor M1 may be on-biased, and a hysteresis phenomenon dependent on a grayscale of a previous frame period may be prevented.

At a time point t2*a*, a second scan signal at a turn-on level (e.g., high level) may be applied to the second scan line GCr. Accordingly, the transistor M3 is turned on, and the transistor M1 is diode-connected, so that a threshold voltage may be compensated.

At a time point t3*a*, a fourth scan signal at a turn-on level (e.g., low level) may be applied to the fourth scan line GBt. Accordingly, the transistor M7 is turned on, and the second initialization line VINTL2 may be connected to the first electrode of the light-emitting element LD. For example, a second initialization voltage may be a sufficiently low voltage, and accordingly, black gradation or low gradation of the light-emitting element LD may be easily expressed. The second initialization voltage may be equal to or less than a voltage of the second power line ELVSSL.

At a time point t4*a*, a third scan signal at a turn-on level (e.g., low level) may be applied to the third scan line GWs. Accordingly, the transistor M2 is turned on, and the data line DLx may be electrically connected to the node N2. Data voltages D(s−1), Ds, D(s+1), and D(s+2) corresponding to each pixel row are sequentially applied to the data line DLx, and at the time point t4*a*, a data voltage Ds corresponding to the pixel PXsx may be applied to the data line DLx. A magnitude of the data voltage Ds may correspond to a grayscale of the pixel PXsx. The data voltage Ds may be applied to the gate electrode of the transistor M1 by sequentially passing through the transistor M2, the transistor M1, and the transistor M3. At this time, a voltage applied to the gate electrode of the transistor M1 is a compensated data voltage Ds including a decrease corresponding to a threshold voltage of the transistor M1. The compensated data voltage Ds is maintained by the capacitor Cst.

At a time point T5*a*, the fourth scan signal at a turn-on level (e.g., low level) may be applied to the fourth scan line GBt. Also, at a time point t6*a*, the third scan signal at a turn-on level (e.g., low level) may be applied to the third scan line GWs.

A display apparatus may be driven by a low-frequency driving method. In this case, each of frame periods may sequentially include a data write period WP, an emission period EP, a bias refresh period, and the emission period EP. Because the transistors M3 and M4 remain in the turn-on state during the bias refresh period, the capacitor Cst maintains the same data voltage for one frame period. During the bias refresh period, the fourth scan signal at a turn-on level (e.g., low level) may be applied to the fourth scan line GBt, and the third scan signal at a turn-on level (e.g., low level) may be applied to the third scan line GWs, the time point t5*a* in which the fourth scan signal is applied and the time point t6*a* in which the third scan signal is applied, which are shown in FIG. 3, may respectively correspond to a time point in which the fourth scan signal is applied and a time point in which the third scan signal is applied during the bias refresh period.

As such, the time point t5*a* in which the fourth scan signal is applied and the time point t6*a* in which the third scan signal is applied during high-frequency driving are matched with the time point t5*a* in which the fourth scan signal is applied and the time point t6*a* in which the third scan signal is applied during low-frequency driving, so that an emission waveform of the light-emitting element LD during high-frequency driving may be made to be similar to an emission waveform of the light-emitting element LD during low-frequency driving.

At a time point t7*a*, an emission signal at a turn-on level (e.g., low level) may be applied to the emission line EMp. Accordingly, the transistors M5 and M6 are turned on, and the light-emitting element LD may be in an emission state.

Figure 4:
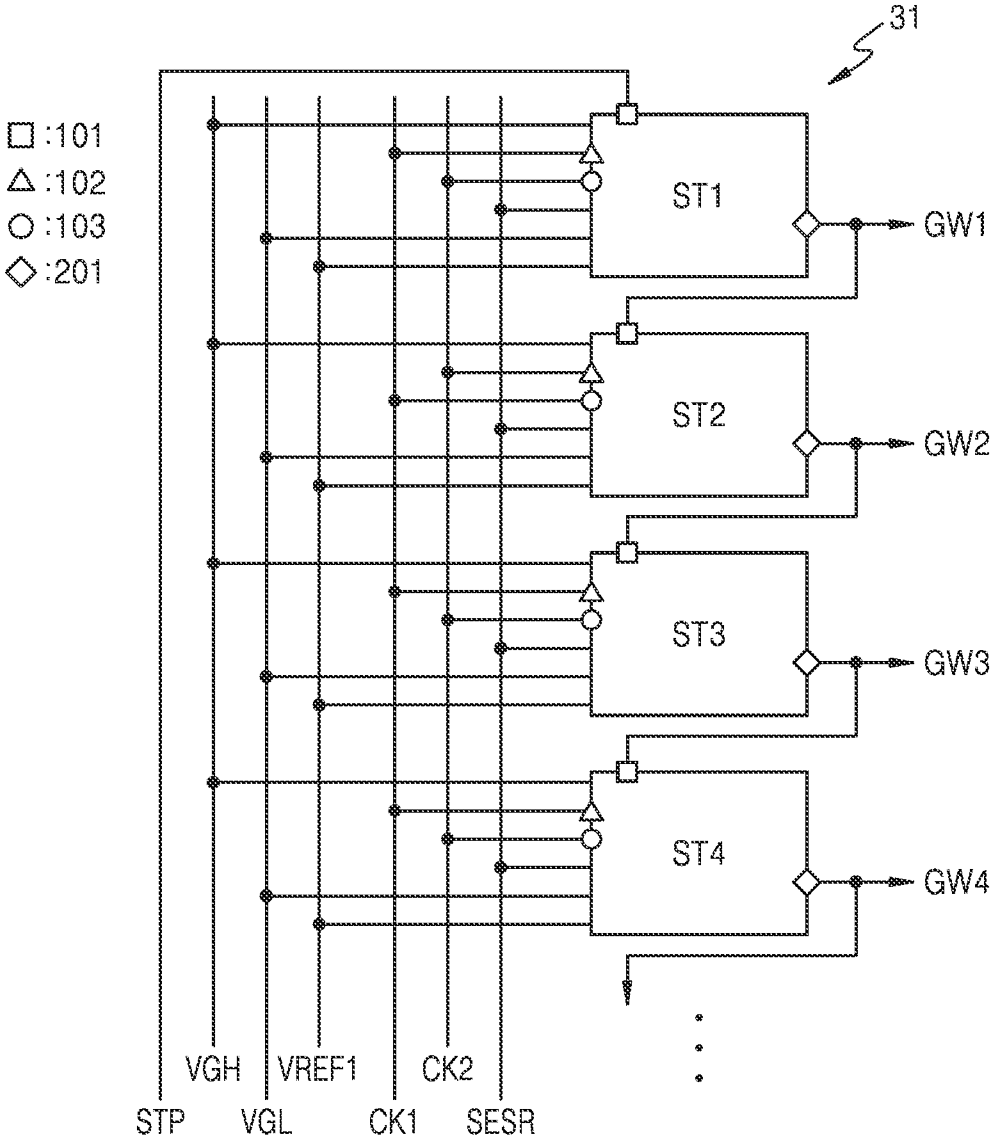
FIG. 4 is a block diagram for explaining a scan driver of a display apparatus according to an embodiment.

FIG. 4 is a block diagram for explaining a scan driver 31 of a display apparatus according to an embodiment.

Hereinafter, for convenience, a case where the scan driver 31 is a third sub scan driver that supplies third scan signals to third scan lines GW1, GW2, GW3, GW4, . . . is described. For reference, as can be seen from the waveform diagram of FIG. 3, a negative pulse is also applied to the fourth scan line GBt. Accordingly, when only the period and timing of clock signals are set differently, a fourth sub scan driver connected to the fourth scan line GBt may also have the same configuration as that of the scan driver 31.

As shown in FIG. 4, the scan driver 31 may include a plurality of stages including first to fourth stages ST1, ST2, ST3, ST4, . . . .

Each of the first to fourth stages ST1, ST2, ST3, and ST4 may include a first input terminal 101, a second input terminal 102, a third input terminal 103, common input terminals, and output terminals 201. Each of the first to fourth stages ST1, ST2, ST3, and ST4 may receive a voltage at a high level VGH, a voltage at a low level VGL, a first reference voltage VREF1, and an initialization signal SESR through common input terminals.

The first input terminal 101 of the first stage ST1 may receive a scan start signal STP. The first input terminals 101 of stages (e.g., the second to fourth stages ST2, ST3, ST4, . . . ) after the first stage ST1 may respectively be connected to the output terminals 201 of previous stages. That is, the first input terminals 101 of stages (e.g., the second to fourth stages ST2, ST3, ST4, . . . ) after the first stage ST1 may respectively receive third scan signals output from previous stages as a carry signal.

The second input terminal 102 and the third input terminal 103 of each of the first to fourth stages ST1, ST2, ST3, and ST4 may receive first and second clock signals CK1 and CK2, which are different from each other. For example, the second input terminals 102 of the first to fourth stages ST1, ST2, ST3, and ST4 may alternately receive the first clock signal CK1 and the second clock signal CK2. For example, the second input terminals 102 of the first and third stages ST1 and ST3, which are odd-numbered stages, may receive the first clock signal CK1. At this time, the second input terminals 102 of the second and fourth stages ST2 and ST4, which are even-numbered stages, may receive the second clock signal CK2.

The third input terminals 103 of the first to fourth stages ST1, ST2, ST3, and ST4 may alternately receive the second clock signal CK2 and the first clock signal CK1. For example, the third input terminals 103 of the first and third stages ST1 and ST3, which are odd-numbered stages, may receive the second clock signal CK2. At this time, the third input terminals 103 of the second and fourth stages ST2 and ST4, which are even-numbered stages, may receive the first clock signal CK1.

Figure 5:
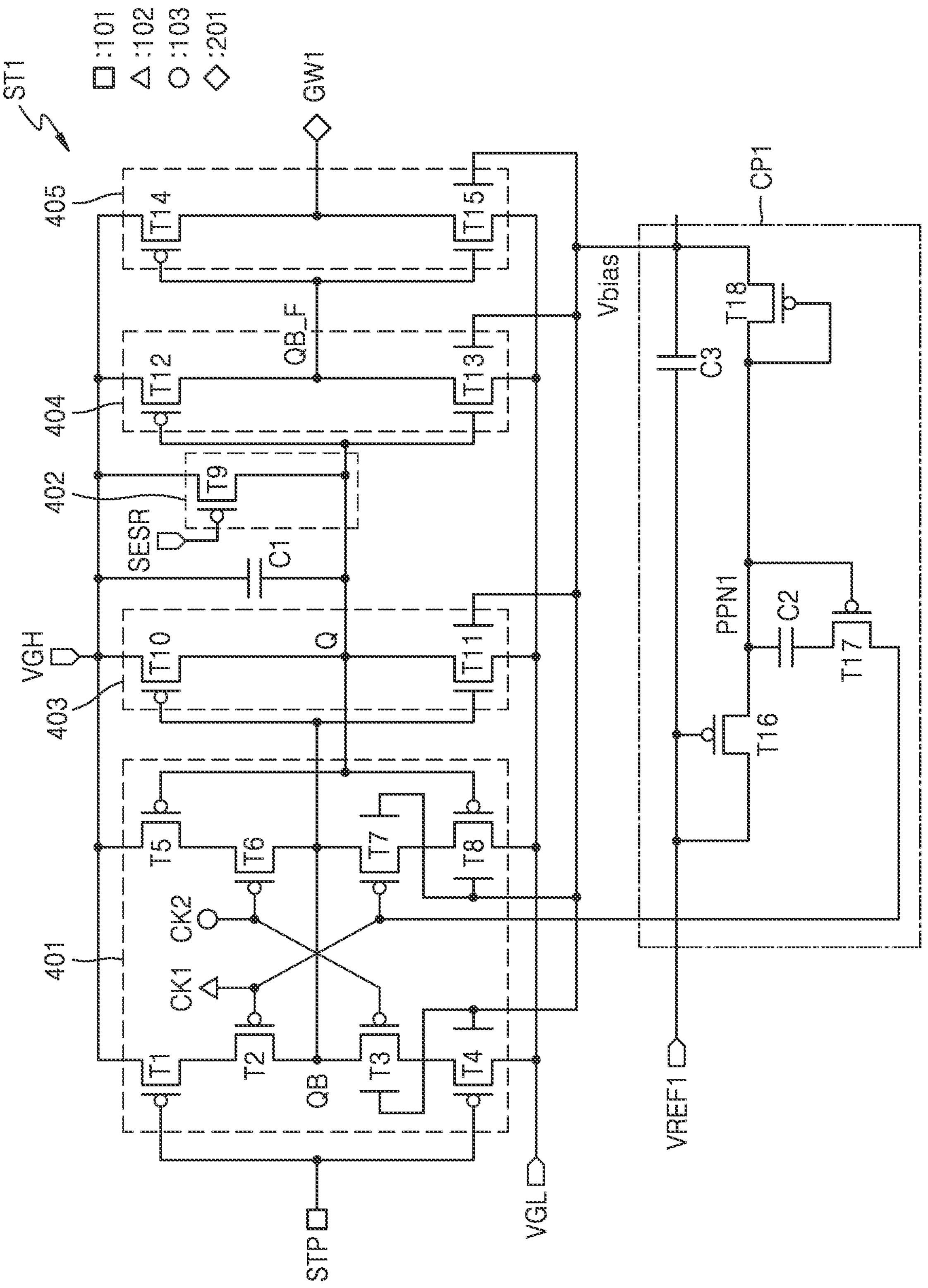
FIG. 5 is a circuit diagram for explaining a stage included in the scan driver of FIG. 4.

FIG. 5 is a circuit diagram for explaining a stage included in the scan driver of FIG. 4. As shown in FIG. 5, the first stage ST1 may be implemented as a complementary metal-oxide semiconductor (CMOS). The first stage ST1 may include a first node setting unit 401, an initialization unit 402, a second node setting unit 403, a third node setting unit 404, an output unit 405, and a first charge pump CP1. The first input terminal 101 of the first stage ST1 receives the scan start signal STP. Because the other stages (e.g., the second to fourth stages ST2, ST3, ST4, . . . ) have the same configuration as the first stage ST1 except that each of the first input terminals 101 thereof receives the carry signal, descriptions already given above are omitted.

The first node setting unit 401 may charge a voltage of a first node QB to a high level when the scan start signal STP is at a low level and the first clock signal CK1 is at a low level. The first node setting unit 401 may include first to eighth transistors T1 to T8. The first node setting unit 401 may include at least one n-type transistor, and FIG. 5 shows that the third transistor T3, the fourth transistor T4, the seventh transistor T7, and the eighth transistor T8 are n-type transistors.

In the first transistor T1, which is a p-type transistor, a first electrode may receive the voltage at the high level VGH, and a gate electrode may receive the scan start signal STP. In the second transistor T2, which is a p-type transistor, a first electrode may be connected to a second electrode of the first transistor T1, a second electrode may be connected to the first node QB, and a gate electrode may receive the first clock signal CK1. In the third transistor T3, which is an n-type transistor, a first electrode may be connected to the first node QB, and a gate electrode may receive the second clock signal CK2. In the fourth transistor T4, which is an n-type transistor, a first electrode may be connected to a second electrode of the third transistor T3, a second electrode may receive the voltage at the low level VGL, and a gate electrode may receive the scan start signal STP.

The fifth transistor T5, which is a p-type transistor, a first electrode may receive the voltage at the high level VGH, and a gate electrode may be connected to a second node Q. The sixth transistor T6, which is a p-type transistor, a first electrode may be connected to a second electrode of the fifth transistor T5, a second electrode may be connected to the first node QB, and a gate electrode may receive the second clock signal CK2. The seventh transistor T7, which is an n-type transistor, a first electrode may be connected to the first node QB, and a gate electrode may receive the first clock signal CK1. The eighth transistor T8, which is an n-type transistor, a first electrode may be connected to a second electrode of the seventh transistor T7, a second electrode may receive the voltage at the low level VGL, and the gate electrode may be connected to the second node Q.

The initialization unit 402 may include a ninth transistor T9. In the ninth transistor T9, which is a p-type transistor, a first electrode may receive the voltage at the high level VGH, a second electrode may be connected to the second node Q, and a gate electrode may receive the initialization signal SESR. The initialization unit 402 may initialize one of the first node QB, the second node Q, and a third mode QB_F according to a logic level of the initialization signal SESR. FIG. 5 shows that the initialization unit 402 initializes the second node Q when the initialization signal SESR is at a low level. The second node Q, which is initialized, may be charged to a high level.

The second node setting unit 403 may charge a voltage of the second node Q to a high level when a voltage of the first node QB is at a low level, and may discharge the voltage of the second node Q to a low level when the voltage of the first node QB is at a high level. The second node setting unit 403 may include tenth and eleventh transistors T10 and T11. The second node setting unit 403 may include at least one n-type transistor.

In the tenth transistor T10, which is a p-type transistor, a first electrode may receive the voltage at the high level VGH, a second electrode may be connected to the second node Q, and a gate electrode may be connected to the first node QB. In the eleventh transistor T11, which is an n-type transistor, a first electrode may be connected to the second node Q, a second electrode may receive the voltage at the low level VGL, and a gate electrode may be connected to the first node QB.

The third node setting unit 404 may charge a voltage of the third mode QB_F when a voltage of the second node Q is at a low voltage, and may discharge the voltage of the third mode QB_F to a low level when the voltage of the second node Q is at a high level. The third node setting unit 404 may include twelfth and thirteenth transistors T12 and T13. The third node setting unit 404 may include at least one n-type transistor.

In the twelfth transistor T12, which is a p-type transistor, a first electrode may receive the voltage at the high level VGH, a second electrode may be connected to the third mode QB_F, and a gate electrode may be connected to the second node Q. In the thirteenth transistor T13, which is an n-type transistor, a first electrode may be connected to the third mode QB_F, a second electrode may receive the voltage at the low level VGL, and a gate electrode may be connected to the second node Q.

The output unit 405 may output a scan signal of the voltage at the high level VGH to the output terminal 201 when a voltage of the third mode QB_F is at a low level, and may output a scan signal of the voltage at the low level VGL to the output terminal 201 when the voltage of the third mode QB_F is at a high level. The output unit 405 may include fourteenth and fifteenth transistors T14 and T15. The output unit 405 may include at least one n-type transistor.

In the fourteenth transistor T14, which is a p-type transistor, a first electrode may receive the voltage at the high level VGH, a second electrode may be connected to the output terminal 201, and a gate electrode may be connected to the third mode QB_F. In the fifteenth transistor T15, which is an n-type transistor, a first electrode may be connected to the output terminal 201, a second electrode may receive the voltage at the low level VGL, and a gate electrode may be connected to the third mode QB_F.

The first stage ST1 may include a first capacitor C1 including a first electrode receiving the voltage at the high level VGH and a second electrode being connected to the second node Q. Because the first capacitor C1 is configured to maintain a voltage of the second node Q, the first electrode thereof may be configured to receive the voltage at the high level VGH. When a parasitic capacitance of the second node Q is sufficient according to a layout, the first capacitor C1 may also be omitted.

The first charge pump CP1 may supply a bias voltage Vbias to a back gate electrode of at least one n-type transistor included in each of the first node setting unit 401, the second node setting unit 403, the third node setting unit 404, and the output unit 405. Accordingly, the first charge pump CP1 may supply the bias voltage Vbias to the back gate electrodes of the third transistor T3, the fourth transistor T4, the seventh transistor T7, the eighth transistor T8, the eleventh transistor T11, the thirteenth transistor T13, and the fifteenth transistor T15.

A semiconductor layer of each of the third, fourth, seventh, eighth, eleventh, thirteenth, and fifteenth transistors T3, T4, T7, T8, T11, T13, and T15 may include an oxide semiconductor. In an embodiment, the oxide semiconductor may have a negative threshold voltage. Accordingly, the bias voltage Vbias, which is less than the voltage at the low level VGL, is applied to the back gate electrode of each of the third, fourth, seventh, eighth, eleventh, thirteenth, and fifteenth transistors T3, T4, T7, T8, T11, T13, and T15, so that each of the third, fourth, seventh, eighth, eleventh, thirteenth, and fifteenth transistors T3, T4, T7, T8, T11, T13, and T15 may be set to have a positive threshold voltage.

The first charge pump CP1 may include sixteenth to eighteenth transistors T16 to T18, a second capacitor C2, and a third capacitor C3. The sixteenth to eighteenth transistors T16 to T18 may be p-type transistors.

In the sixteenth transistor T16, a gate electrode and a first electrode may receive the first reference voltage VREF1, and a second electrode may be connected to a fourth node PPN1. In the second capacitor C2, a first electrode may be connected to the fourth node PPN1. In the seventeenth transistor T17, a first electrode may be connected to a second electrode of the second capacitor C2, a second electrode may receive the first clock signal CK1, and a gate electrode may be connected to the fourth node PPN1. In some cases, the second electrode of the seventeenth transistor T17 may also receive the second clock signal CK2. In the eighteenth transistor T18, a first electrode and a gate electrode may be connected to the fourth node PPN1, and a second electrode may supply the bias voltage Vbias. In the third capacitor C3, a first electrode may receive the first reference voltage VREF1, and a second electrode may be connected to the second electrode of the eighteenth transistor T18. Because the third capacitor C3 is configured to maintain a voltage of the bias voltage Vbias, the first electrode thereof may also be configured to receive the voltage at the low level VGL. In some cases, when a parasitic capacitance for the bias voltage Vbias is sufficient, the third capacitor C3 may be omitted.

Figure 6:
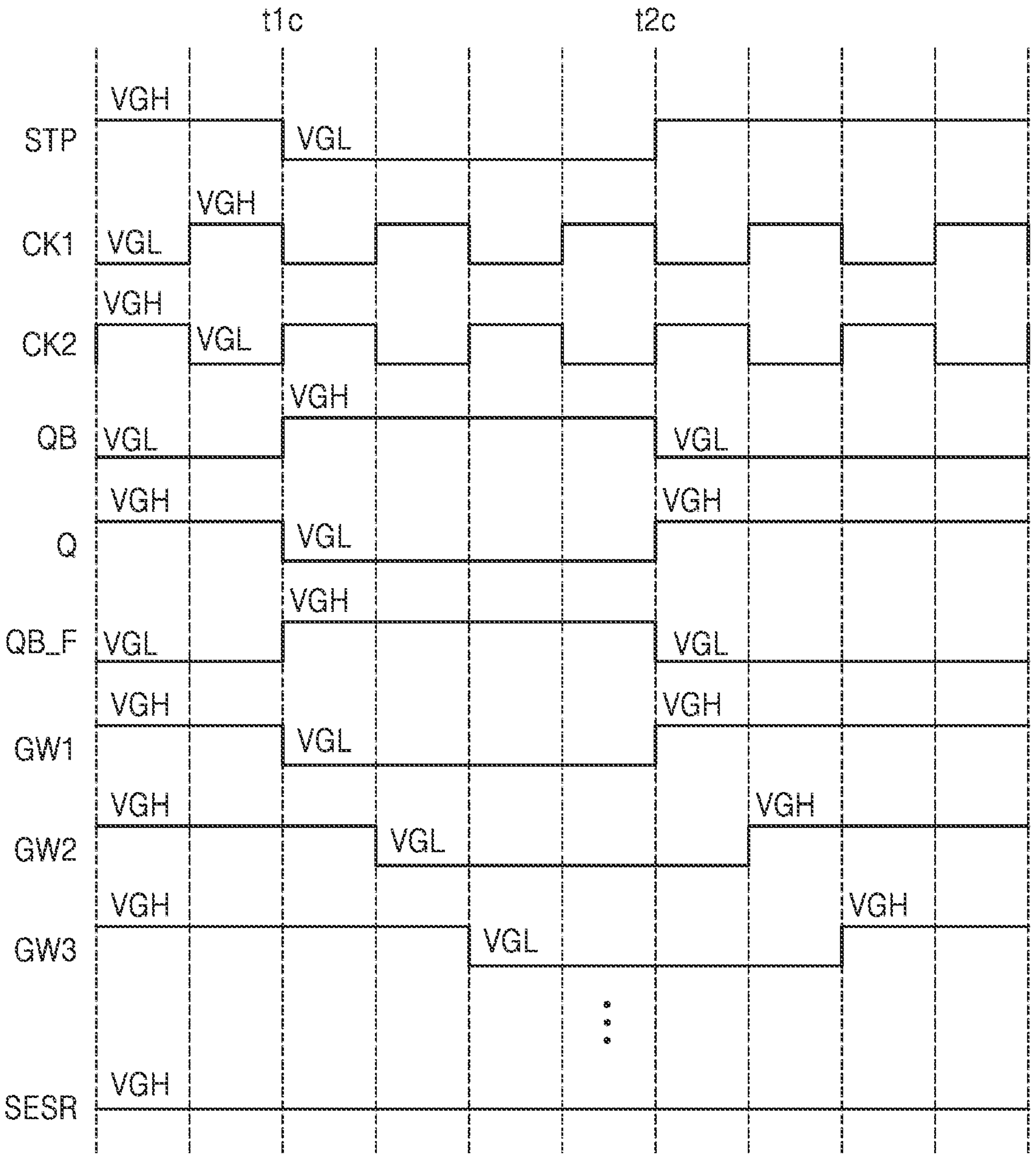
FIG. 6 is a waveform diagram for explaining an example operation of the stage of FIG. 5.

FIG. 6 is a waveform diagram for explaining an example operation of the stage of FIG. 5.

Referring to FIGS. 5 and 6, before a time point t1*c*, the initialization signal SESR is set to the low level VGL, and the second node Q of each of the first to fourth stages ST1, ST2, ST3, ST4, . . . may be initialized to a high level. Thereafter, before the time point t1*c*, the initialization signal SESR may be set to the high level VGH, as shown in FIG. 6.

Phases of the first clock signal CK1 and the second clock signal CK2 may be different from each other by 180 degrees. For example, when the first clock signal CK1 is at the high level VGH, the second clock signal CK2 may be the low level VGL, and when the first clock signal CK1 is at the low level VGL, the second clock signal CK2 may be the high level VGH.

At the time point t1*c*, the scan start signal STP of the low level VGL may be supplied. At this time, the first clock signal CK1 may be the low level VGL. Accordingly, the first transistor T1 and the second transistor T2 may be turned on, and a voltage of the first node QB may be charged to the high level VGH.

Because the voltage of the first node QB is at the high level VGH, the eleventh transistor T11 may be turned on. Accordingly, a voltage of the second node Q may be discharged to the low-level VGL. Accordingly, the twelfth transistor T12 may be turned on, and a voltage of the third mode QB_F may be charged to the high level VGH. Accordingly, the fifteenth transistor T15 may be turned on, and the voltage at the low level VGL may be applied to the output terminal 201. Accordingly, a third scan signal at the low level VGL may be output to a third scan line GW1.

At a time point t2*c*, as the scan start signal STP at the high level VGH is supplied, the voltages of the first node QB and the third mode QB_F may be discharged to the low level VGL, and the voltage of the second node Q may be charged to the high level VGH. Accordingly, a third scan signal at the high level VGH may be output to the third scan line GW1.

In the second stage ST2, when the third scan signal of the third scan line GW1 and the second clock signal CK2 are at the low level VGL, the third scan signal at the low level VGL may be output to the third scan line GW2. In the third stage ST3, when the third scan signal of the third scan line GW2 and the first clock signal CK1 are at the low level VGL, the third scan signal at the low level VGL may be output to the third scan line GW3. Accordingly, the scan driver 31 may sequentially output the third scan signals at the low level VGL.

Figure 7:
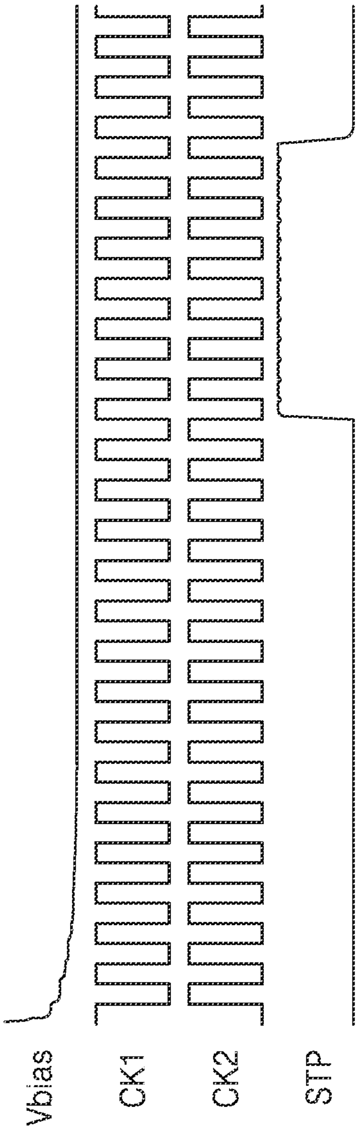
FIG. 7 is a waveform diagram for explaining a first bias voltage.

FIG. 7 is a waveform diagram for explaining a first bias voltage.

Referring to FIGS. 5 to 7, the bias voltage Vbias may be settled before the scan start signal STP at a high level is generated. Because the sixteenth transistor T16 is diode-connected, an initial voltage of the fourth node PPN1 may correspond to a value obtained by subtracting a threshold voltage of the sixteenth transistor T16 from the first reference voltage VREF1. The first reference voltage VREF1 may be set to be greater than the low level VGL and less than the high level VGH. When the first clock signal CK1 changes from the high level VGH to the low level VGL, a voltage of the fourth node PPN1 may decrease by a voltage difference VGH-VGL. At this time, charges on the back gate electrodes of the third, fourth, seventh, eighth, eleventh, thirteenth, and fifteenth transistors T3, T4, T7, T8, T11, T13, and T15 are released through the eighteenth transistor T18, which is turned on. By repeating this process (e.g., charge pumping, the settled bias voltage Vbias may become less than the voltage at the low level VGL. Accordingly, because a low voltage source less than the voltage at the low level VGL is unnecessary, power consumption may be reduced.

Figure 8:
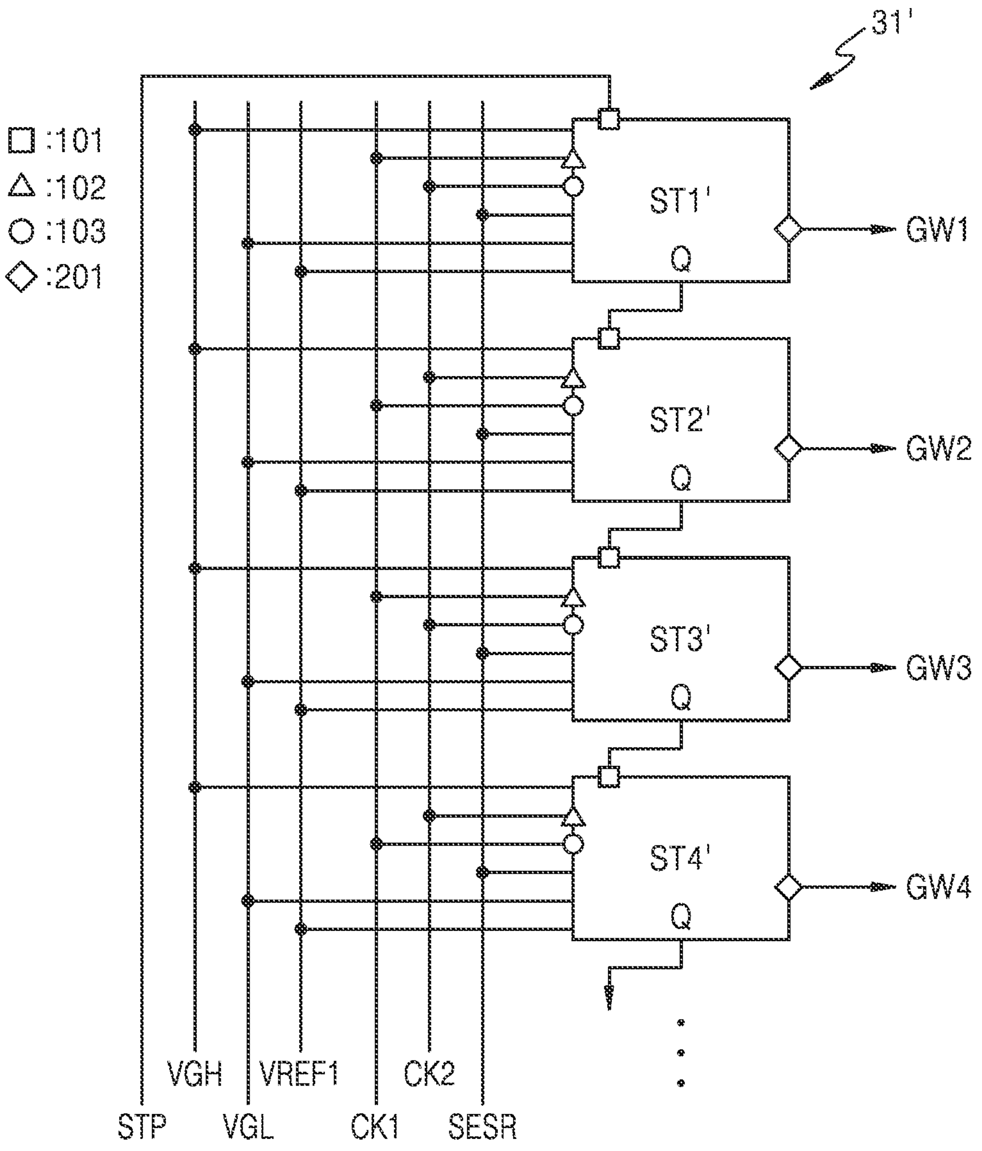
FIG. 8 is a block diagram for explaining a scan driver of a display apparatus according to an embodiment.

FIG. 8 is a block diagram for explaining a scan driver 31' of a display apparatus according to an embodiment. Unlike the scan driver 31 of FIG. 4, in the scan driver 31' of FIG. 8, the first input terminals 101 of other stages (e.g., second to fourth stages ST2', ST3', ST4', . . . ) except a first stage ST1' may each be connected to the second node Q of a previous stage.

Referring to FIG. 6, because a voltage level of the second node Q and a voltage level of the third scan signal are synchronized, the scan driver 31' of FIG. 8 may operate in the same way as the scan driver 31 of FIG. 4. Because a circuit structure of each of stages ST1' to ST'4 is the same as that shown in FIG. 5, a description thereof is omitted. A stage having a stage circuit diagram of FIG. 9 described below may also be applied to the scan driver of FIG. 4 or the scan driver of FIG. 8.

Figure 9:
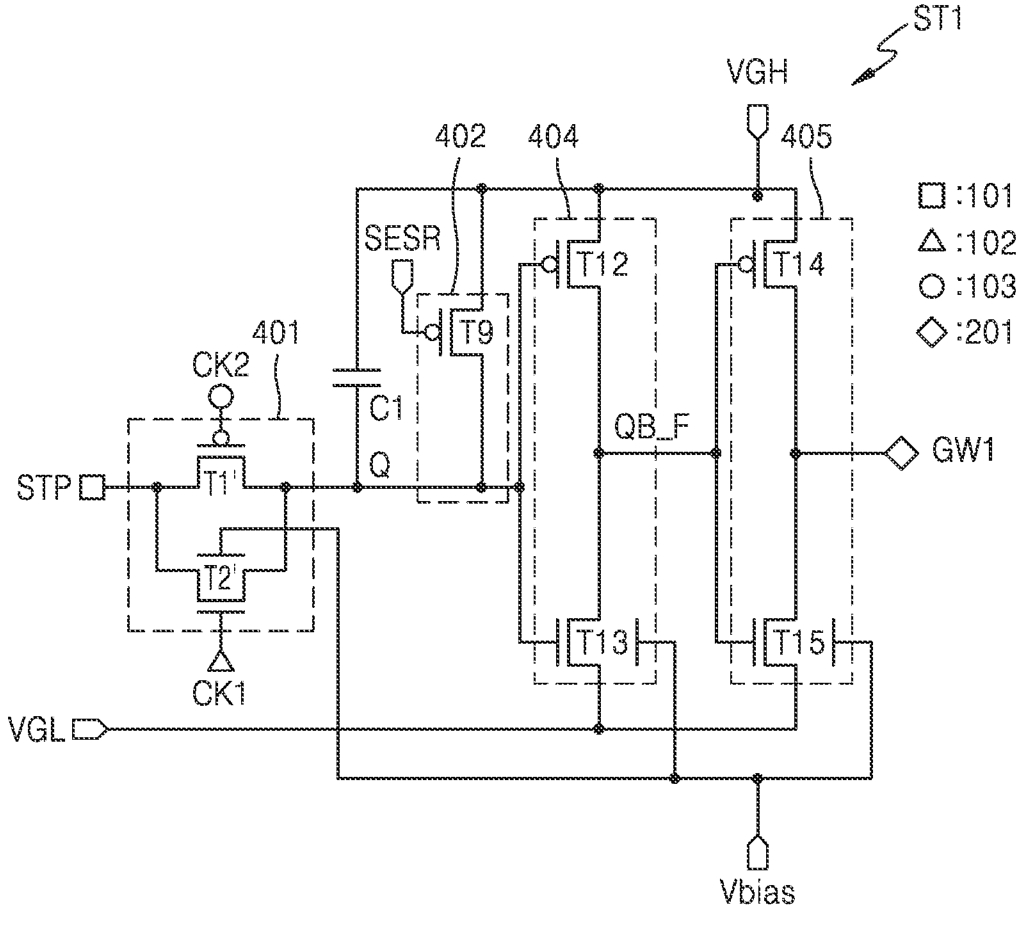
FIG. 9 is a circuit diagram for explaining a stage of a scan driver of a display apparatus according to an embodiment.

FIG. 9 is a circuit diagram for explaining a stage of a scan driver of a display apparatus according to an embodiment.

A circuit diagram of the first stage ST1 of FIG. 9 is different from a circuit diagram of the first stage ST1 shown in FIG. 5 in that a configuration of the first node setting unit 401 is simplified by changing the first node setting unit 401 to include a first substitute transistor T1', which is a p-type transistor, and a second substitute transistor T2', which is an n-type transistor, and the second node setting unit 403 is omitted. In addition, because the description has already given with reference to FIG. 5, particular descriptions are omitted.

In the first substitute transistor T1', which is a p-type transistor, a first electrode may receive the scan start signal STP, and a gate electrode may receive the second clock signal CK2. In the second substitute transistor T2', which is an n-type transistor, a first electrode may receive the scan start signal STP, a gate electrode may receive the first clock signal CK1, and a second electrode may be connected a second electrode of the first substitute transistor T1' and the second node Q.

Figure 10:
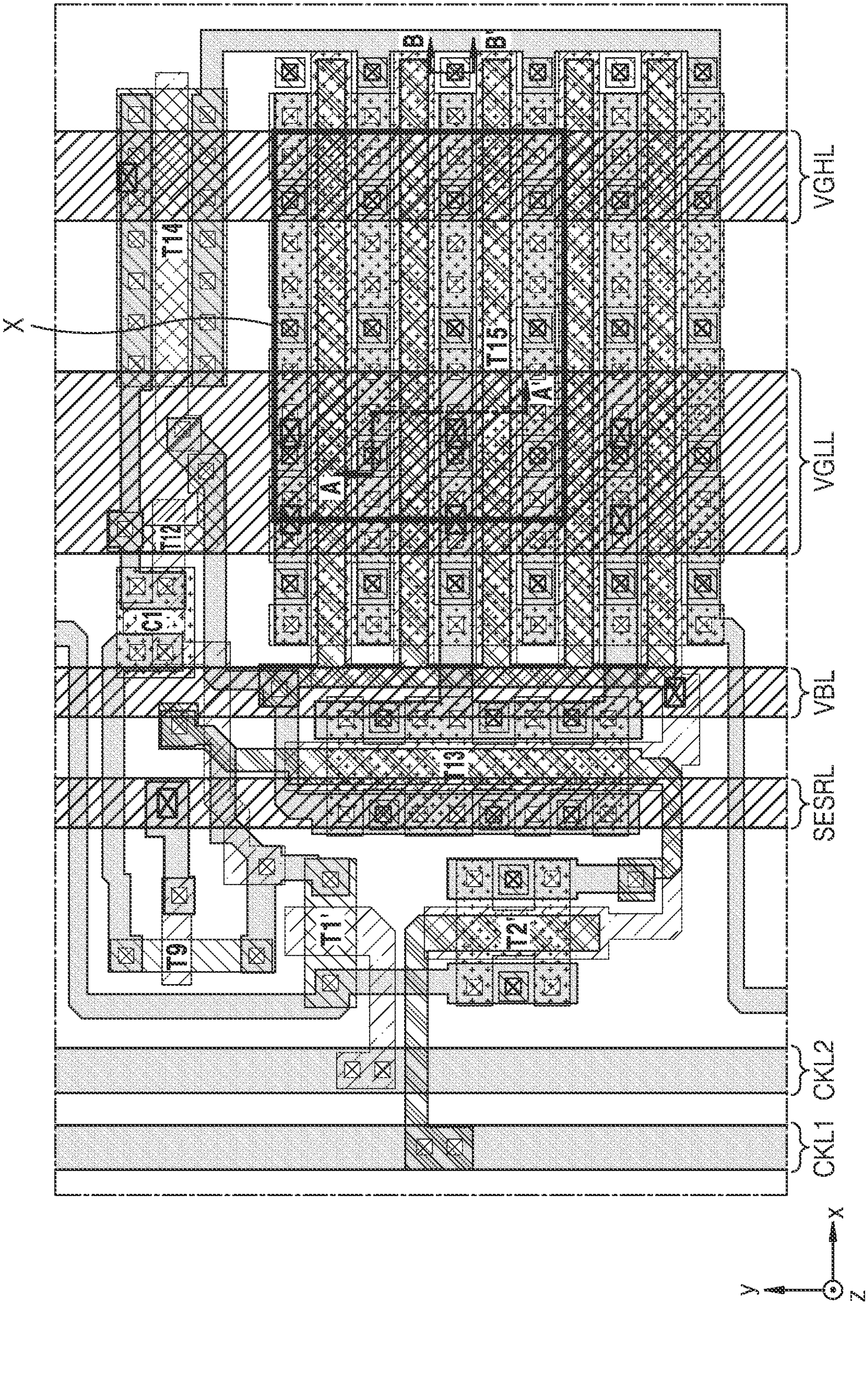
FIG. 10 is a layout view schematically illustrating positions of transistors and capacitors included in a stage of a scan driver of a display apparatus according to an embodiment.

FIG. 10 is a layout view schematically illustrating positions of transistors and capacitors included in a stage of a scan driver of a display apparatus according to an embodiment, schematically illustrating positions of the transistors T1', T2', T9, T12, T13, T14, and T15 and the first capacitor C1 included in the stage of FIG. 9. FIGS. 11A to 11F are layout views schematically illustrating components such as the transistors T1', T2', T9, T12, T13, T14, and T15 and the first capacitor C1 shown in FIG. 10 for each layer, and FIG. 12 is a cross-sectional view illustrating cross sections respectively taken along a line A-A' and a line B-B' of FIG. 10.

The display apparatus 9 may a substrate 100 (refer to FIG. 12), and various components, such as the transistors T1', T2', T9, T12, T13, T14, and T15 and the first capacitor C1, included in a stage of a scan driver may be positioned on the substrate 100. As shown in FIG. 9, the first substitute transistor T1', the ninth transistor T9, the twelfth transistor T12, and the fourteenth transistor T14 may be p-type transistors, and the second substitute transistor T2', the thirteenth transistor T13, and the fifteenth transistor T15 may be n-type transistors.

The substrate 100 may include glass, metal, or polymer resin. When the substrate 100 is flexible or bendable, the substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including the polymer resin and a barrier layer including an inorganic material (for example, silicon oxide, silicon nitride, silicon oxynitride, or the like) arranged between the two layers, and various modifications may be made.

A buffer layer 111 (refer to FIG. 12) may be disposed on the substrate 100. The buffer layer 111 may include, for example, an inorganic insulating material such as silicon oxide, silicon nitride, silicon oxynitride, or aluminum oxide. The buffer layer 111 may prevent a phenomenon in which metal atoms or impurities from the substrate 100 diffuse to a first active layer ATL1 (refer to FIG. 11A) positioned thereon.

Figure 11A:
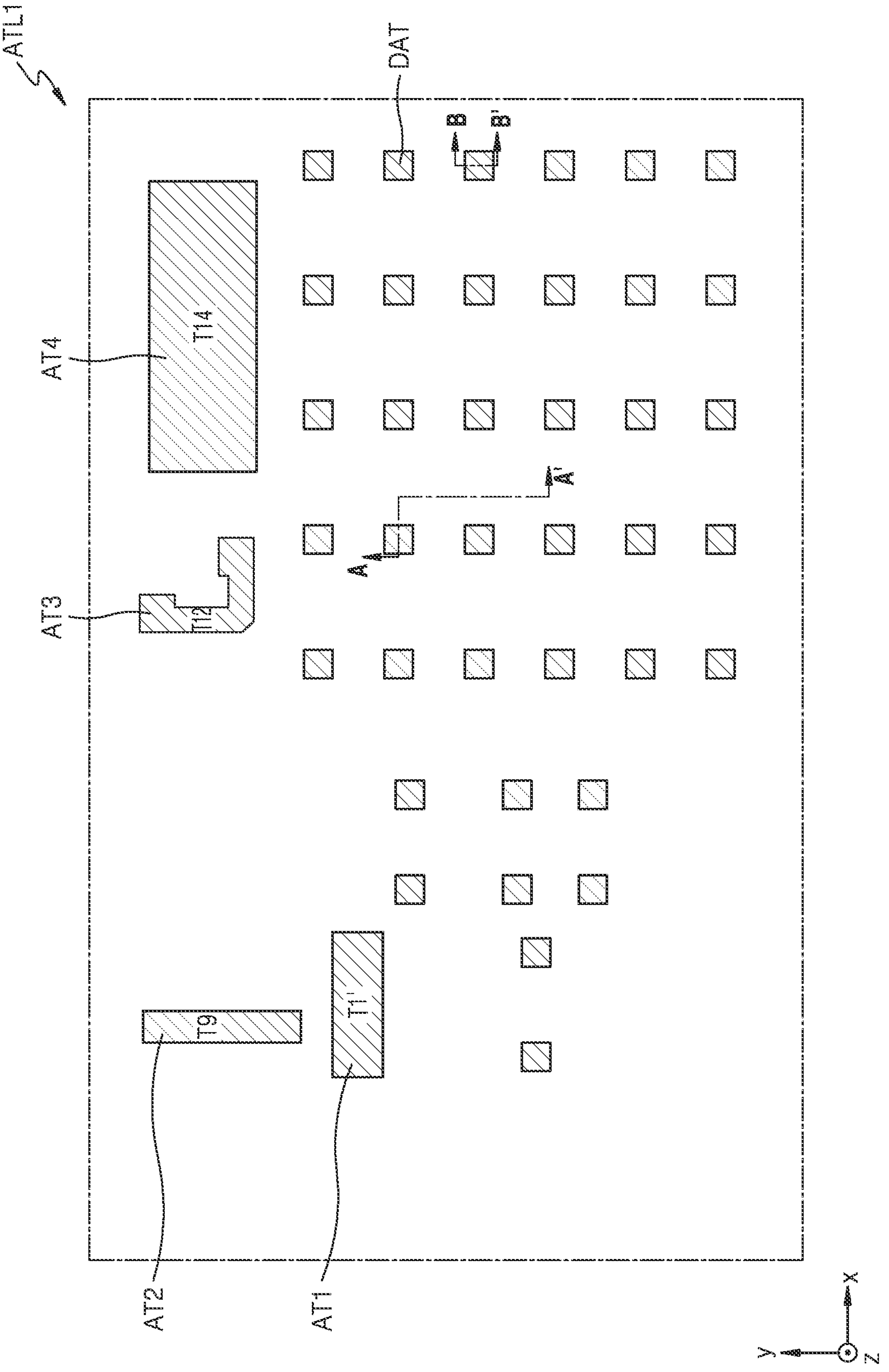
FIGS. 11A, 11B, 11C, 11D, 11E, and 11F are layout views schematically illustrating components such as transistors and capacitors shown in FIG. 10 for each layer.
Figure 12:
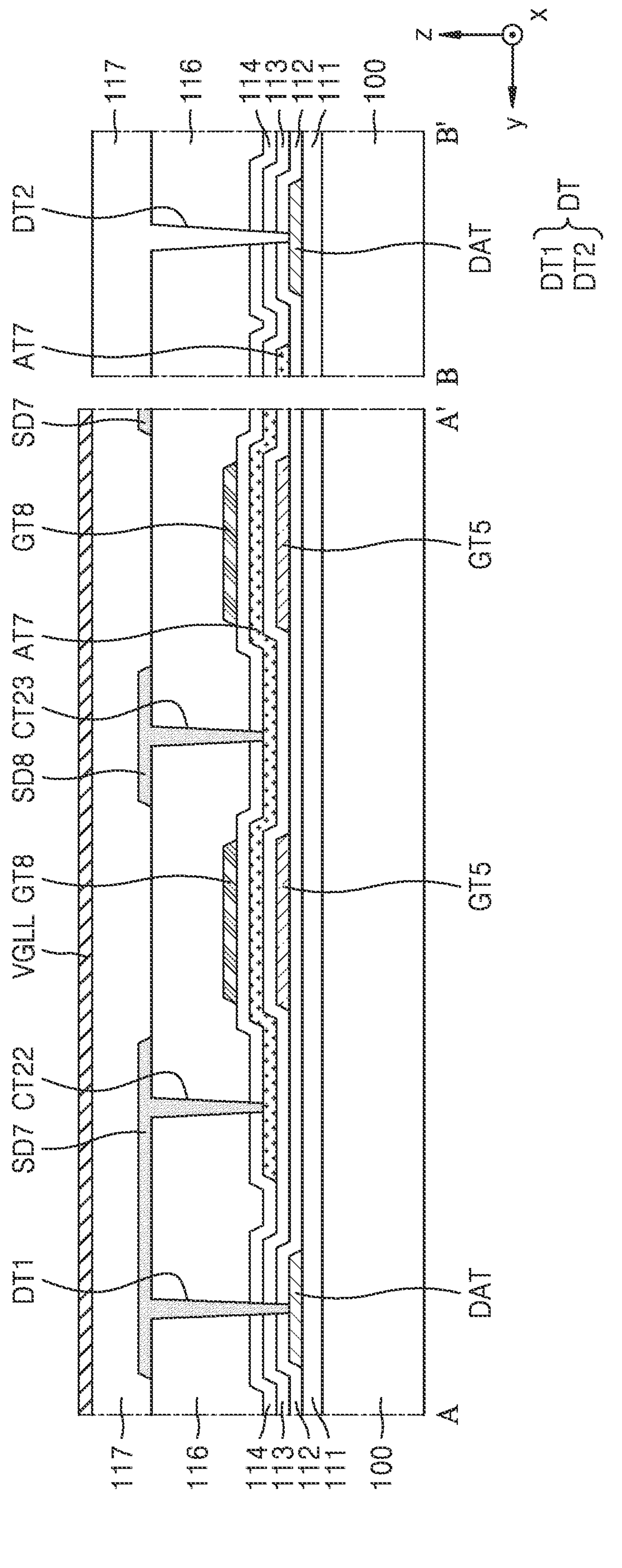
FIG. 12 is a cross-sectional view illustrating cross sections respectively taken along a line A-A' and a line B-B' of FIG. 10.

The first active layer ATL1 shown in FIG. 11A may be disposed on the buffer layer 111. The first active layer ATL1 may include a silicon semiconductor. For example, the first active layer ATL1 may include amorphous silicon or polysilicon. In particular, the first active layer ATL1 may include polysilicon crystallized at a low temperature. When necessary, ions may be implanted into at least a portion of the first active layer ATL1. An ion-implanted portion of the first active layer ATL1 may have conductivity. Accordingly, a portion of the first active layer ATL1 may be regarded as a first electrode or a second electrode of a transistor as needed. This is similar to the case of a second active layer ATL2 to be described below.

The first active layer ATL1 may include a first sub active layer AT1, a second sub active layer AT2, a third sub active layer AT3, a fourth sub active layer AT4, and dummy active layers DAT. The first sub active layer AT1, the second sub active layer AT2, the third sub active layer AT3, the fourth sub active layer AT4, and the dummy active layers DAT may be spaced apart from each other. Each of the first sub active layer AT1, the second sub active layer AT2, the third sub active layer AT3, the fourth sub active layer AT4, and the dummy active layers DAT may have an isolated shape. The first sub active layer AT1, the second sub active layer AT2, the third sub active layer AT3, and the fourth sub active layer AT4 may be electrically connected to each other by a first source drain layer SDL1 as will be described below with reference to FIG. 11E.

The first sub active layer AT1 may include a channel region of the first substitute transistor T1', and a source region and a drain region, which are respectively on both sides of the channel region. The second sub active layer AT2 may include a channel region of the ninth transistor T9, and a source region and a drain region, which are respectively on both sides of the channel region. The third sub active layer AT3 may include a channel region of the twelfth transistor T12, and a source region and a drain region, which are respectively on both sides of the channel region. The fourth sub active layer AT4 may include a channel region of the fourteenth transistor T14, and a source region and a drain region, which are respectively on both sides of the channel region. A function of the dummy active layers DAT is described below.

A first gate insulating layer 112 (refer to FIG. 12) may cover the first active layer ATL1, and may be disposed on the buffer layer 111. The first gate insulating layer 112 may include an insulating material. For example, the first gate insulating layer 112 may include an inorganic insulating material, such as silicon oxide, silicon nitride, silicon oxynitride, aluminum oxide, or the like.

Figure 11B:
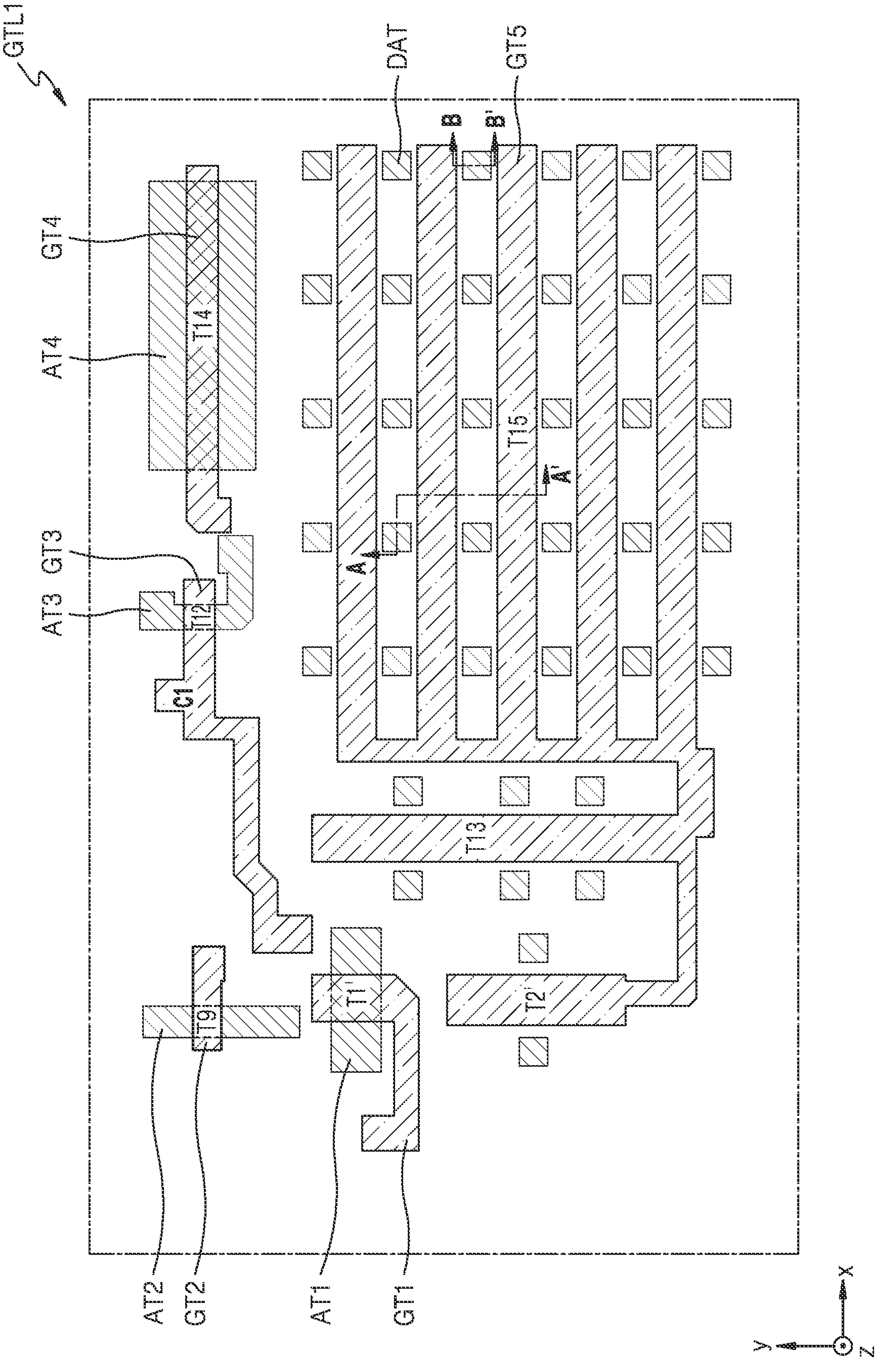

A first gate layer GTL1 shown in FIG. 11B may be on the first gate insulating layer 112. The first gate layer GTL1 may include a first gate GT1, a second gate GT2, a third gate GT3, a fourth gate GT4, and a fifth gate GT5, which are spaced apart from each other. For reference, FIG. 11B shows the first gate layer GTL1 together with the first active layer ATL1 for convenience.

The first gate GT1 may function as a gate electrode of the first substitute transistor T1' by overlapping a portion of the first sub active layer AT1, for example, the channel region of the first sub active layer AT1. The second gate GT2 may function as a gate electrode of the ninth transistor T9 by overlapping a portion of the second sub active layer AT2. The third gate GT3 may function as a gate electrode of the twelfth transistor T12 by overlapping a portion of the third sub active layer AT3, for example, the channel region of the third sub active layer AT3. A portion of the third gate GT3 may function as a second electrode of the first capacitor C1. In other words, the gate electrode of the twelfth transistor T12 may be integrated with the second electrode of the first capacitor C1. The fourth gate GT4 may function as a gate electrode of the fourteenth transistor T14 by overlapping a portion of the fourth sub active layer AT4, for example, the channel region of the fourth sub active layer AT4.

The fifth gate GT5 integrally has a shape passing between the dummy active layers DAT. The fifth gate GT5 may be positioned below the gate electrode of the second substitute transistor T2', the gate electrode of the thirteenth transistor T13, and the gate electrode of the fifteenth transistor T15, which will be described below, to function as a back gate electrode of each transistor. The fifth gate GT5 may receive the bias voltage Vbias.

The first gate layer GTL1 may include a metal, an alloy, a conductive metal oxide, a transparent conductive material, or the like. For example, the first gate layer GTL1 may include silver (Ag), an alloy containing Ag, molybdenum (Mo), an alloy containing Mo, aluminum (Al), an alloy containing Al, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. The first gate layer GTL1 may have a multi-layered structure. For example, the first gate layer GTL1 may have a two-layered structure of Mo/Al, a two-layered structure of Mo/Ti, or a three-layered structure of Mo/Al/Mo. Components of the first gate layer GTL1 may be simultaneously formed of the same material and have the same layer structure.

A second gate insulating layer 113 (refer to FIG. 12) may cover the first gate layer GTL1, and may be positioned on the first gate insulating layer 112. The second gate insulating layer 113 may include an insulating material, which is the same as or similar to that of the first gate insulating layer 112.

Figure 11C:
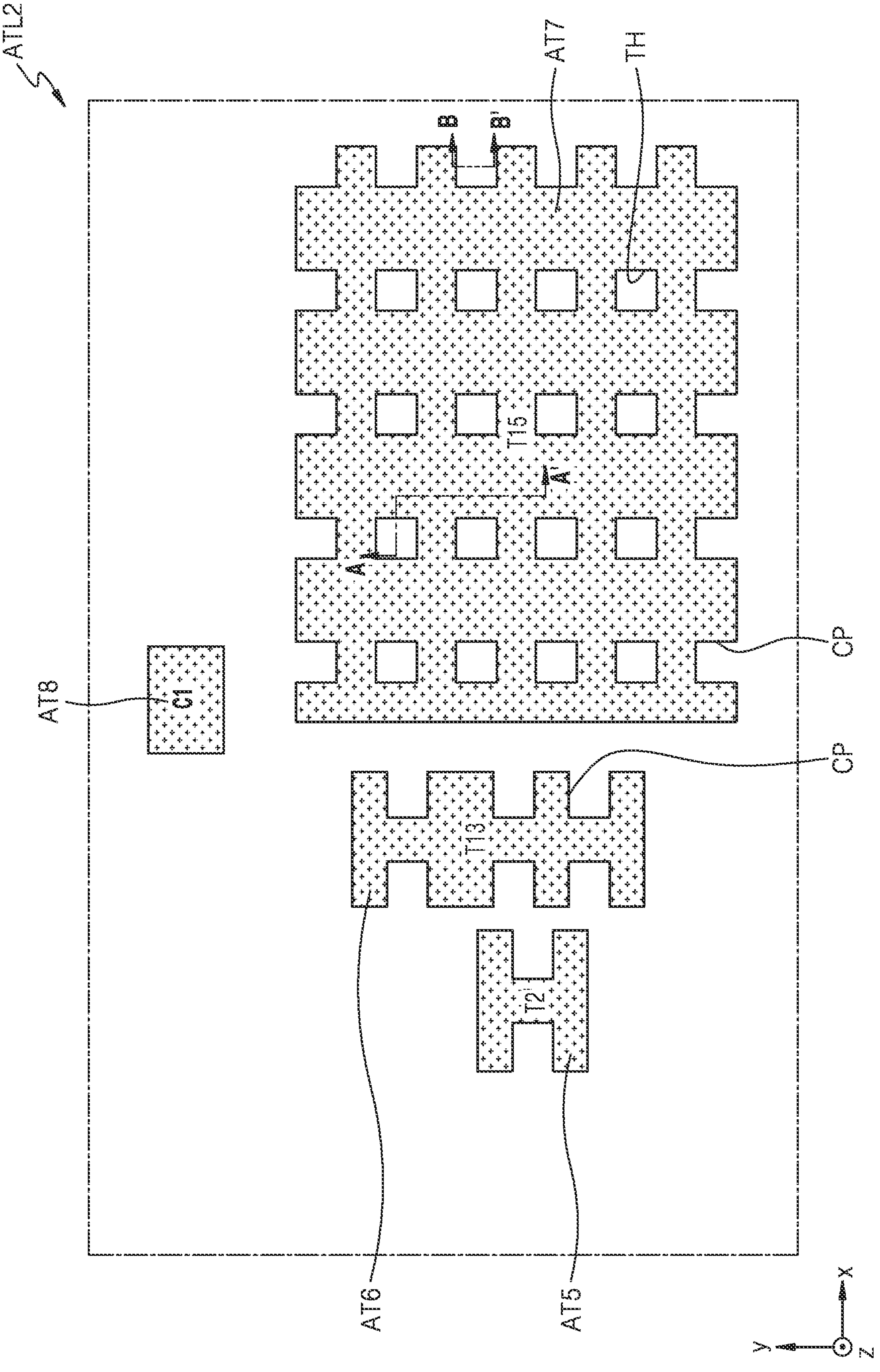

The second active layer ATL2 shown in FIG. 11C may be disposed on the second gate insulating layer 113. The second active layer ATL2 may include an oxide semiconductor. For example, the oxide semiconductor is a Zn oxide-based material, which may include Zn oxide, In—Zn oxide, or Ga—In—Zn oxide. Alternatively, the oxide semiconductor may include In—Ga—Zn—O (IGZO), In—Sn—Zn—O (ITZO), or In—Ga—Sn—Zn—O (IGTZO), which includes a metal such as indium (In), gallium (Ga), and tin (Sn) in zinc oxide (ZnO). Ions may be implanted into at least a portion of the second active layer ATL2.

The second active layer ATL2 may include a fifth sub active layer AT5, a sixth sub active layer AT6, a seventh sub active layer AT7, and an eighth sub active layer AT8. Each of the fifth sub active layer AT5, the sixth sub active layer AT6, the seventh sub active layer AT7, and the eighth sub active layer AT8 may have an isolated shape. The fifth sub active layer AT5, the sixth sub active layer AT6, the seventh sub active layer AT7, and the eighth sub active layer AT8 may be spaced apart from each other. The fifth sub active layer AT5, the sixth sub active layer AT6, the seventh sub active layer AT7, and the eighth sub active layer AT8 may be electrically connected to each other by the first source drain layer SDL1 as will be described below with reference to FIG. 11E.

The fifth sub active layer AT5 may include a channel region of the second substitute transistor T2', and a source region and a drain region, which are respectively on both sides of the channel region. The sixth sub active layer AT6 may include a channel region of the thirteenth transistor T13, and a source region and a drain region, which are respectively on both sides of the channel region. The seventh sub active layer AT7 may include a channel region, a source region, and a drain region of the fifteenth transistor T15. The eighth sub active layer AT8 may function as a first electrode of the first capacitor C1 by overlapping a portion of the third gate GT3.

Referring to FIG. 11C, in a plan view, each of the fifth sub active layer AT5 and the sixth sub active layer AT6 may have a plurality of concave portions on the outside. The seventh sub active layer AT7 may have a plurality of concave portions CP on the outside. Also, the seventh sub active layer AT7 may have a plurality of through holes TH. Herein, 'in a plan view' means viewing from a direction (z direction) perpendicular to the substrate 100.

The dummy active layers DAT described above with reference to FIG. 11A may be spaced apart from the second active layer ATL2 in a plan view. Each of the dummy active layers DAT may be arranged adjacent to at least a portion of the second active layer ATL2. For example, in a plan view, each of the dummy active layers DAT is spaced apart from the fifth sub active layer AT5, the sixth sub active layer AT6, and the seventh sub active layer AT7, and may be arranged adjacent to any one of the fifth sub active layer AT5, the sixth sub active layer AT6, and the seventh sub active layer AT7.

Some of the dummy active layers DAT may correspond to the through holes TH of the seventh sub active layer AT7. Each of some of the dummy active layers DAT may be positioned in a corresponding one of the through holes TH. Also, some other of the dummy active layers DAT may correspond to the concave portions CP of the seventh sub active layer AT7. Each of the some other of the dummy active layers DAT may be positioned in a corresponding one of the concave portions CP of the seventh sub active layer AT7.

As will be described below, the dummy active layers DAT may overlap dummy holes DT arranged adjacent to the second active layer ATL2, for example, the third sub active layer AT3, the fifth sub active layer AT5, or the seventh sub active layer AT7. The dummy active layers DAT may prevent defects in a display apparatus from occurring due to foreign materials entering from a lower portion of a substrate through the dummy holes DT. Also, in a plan view, the dummy active layers DAT are arranged to be positioned in the through holes of the seventh sub active layer AT7, so that a portion of an insulating layer covering the seventh sub active layer AT7 may be substantially flat even though the seventh sub active layer AT7 includes the through holes. In an embodiment, a first semiconductor layer in claims may be the seventh sub active layer AT7, and a second semiconductor layer in claims may be any one of the first sub active layer AT1 to the fourth sub active layer AT4. Also, a dummy semiconductor layer in claims may be the dummy active layer DAT.

A third gate insulating layer 114 (refer to FIG. 12) may cover the second active layer ATL2, and may be disposed on the second gate insulating layer 113. The third gate insulating layer 114 may include an insulating material. The third gate insulating layer 114 may include an inorganic insulating material, such as silicon oxide, silicon nitride, silicon oxynitride, aluminum oxide, or the like.

Figure 11D:
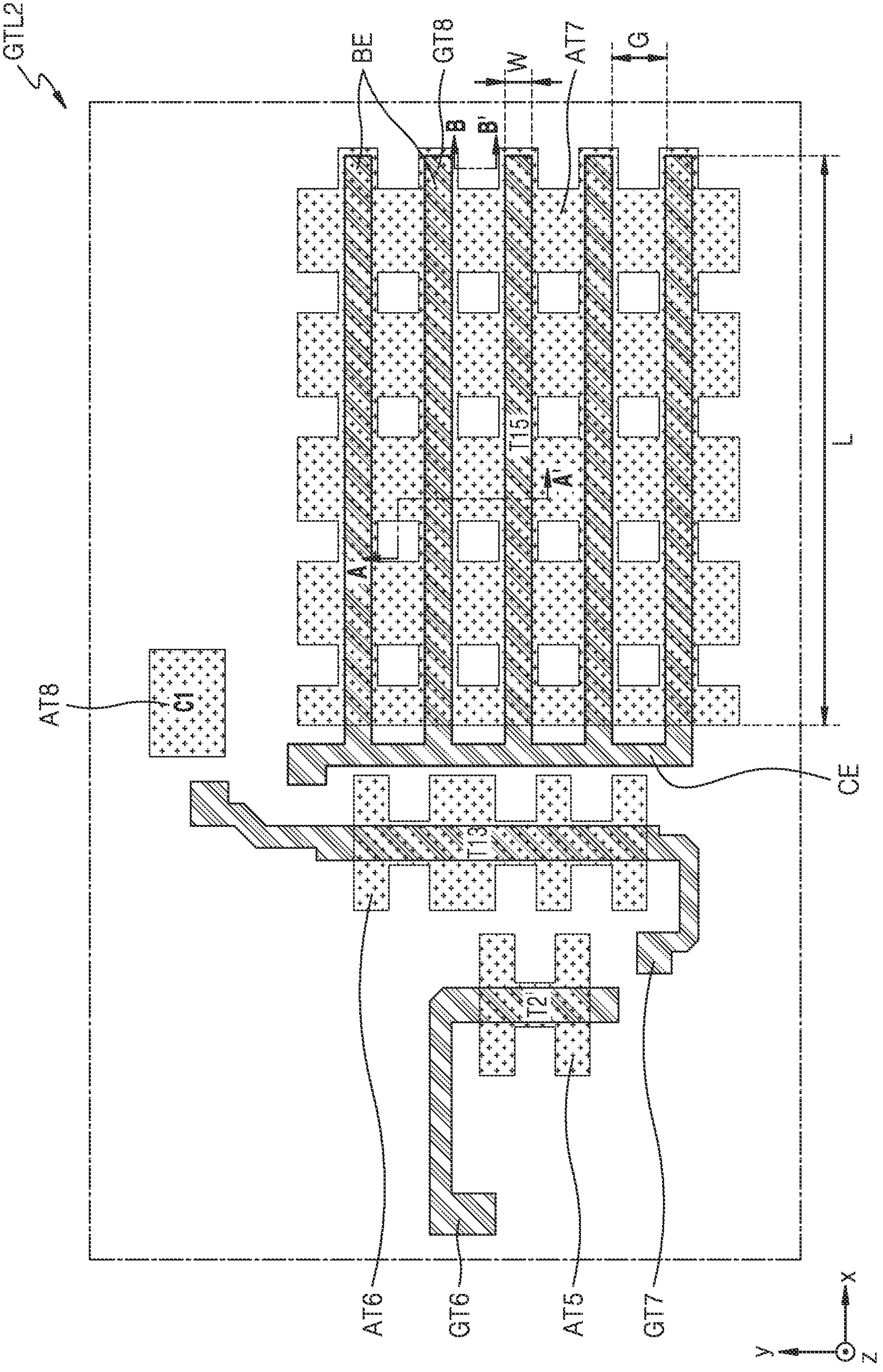

A second gate layer GTL2 shown in FIG. 11D may be on the third gate insulating layer 114. The second gate layer GTL2 may include a sixth gate GT6, a seventh gate GT7, and an eighth gate GT8, which are spaced apart from each other. For reference, FIG. 11D shows the second gate layer GTL2 together with the second active layer ATL2 for convenience.

The sixth gate GT6 may function as a gate electrode of the second substitute transistor T2' by overlapping a portion of the fifth sub active layer AT5, for example, the channel region of the fifth sub active layer AT5. The seventh gate GT7 may function as a gate electrode of the thirteenth transistor T13 by overlapping a portion of the sixth sub active layer AT6, for example, the channel region of the sixth sub active layer AT6. The eighth gate GT8 may function as a gate electrode of the fifteenth transistor T15 by overlapping a portion of the seventh sub active layer AT7, for example, the channel region of the seventh sub active layer AT7.

The eighth gate GT8 may include a plurality of branch electrodes BE extending in a first direction (e.g., an x direction). The plurality of branch electrodes BE may be positioned between through holes of the seventh sub active layer AT7. The plurality of branch electrodes BE may be electrically connected to each other by a connection electrode CE extending in a second direction (e.g., a y direction) crossing the first direction (e.g., the x direction). As shown in FIG. 11D, the plurality of branch electrodes BE of the eighth gate GT8 may be integrally provided with the connection electrode.

The eighth gate GT8 may include branch electrodes BE and may have a large area overlapping the seventh sub active layer AT7. In an embodiment, in a plan view, lengths L of some of the plurality of branch electrodes BE, in the first direction (x direction), may be substantially the same. Also, a gap G between the branch electrodes may be constant. Widths W of the branch electrodes in the second direction (y direction) may be designed to be constant. Accordingly, the characteristics of the fifteenth transistor T15 may be constant.

The second gate layer GTL2 may include a metal, an alloy, a conductive metal oxide, a transparent conductive material, or the like. For example, the second gate layer GTL2 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second gate layer GTL2 may have a multi-layered structure. For example, the second gate layer GTL2 may have a two-layered structure of Mo/Al, a two-layered structure of Mo/Ti, or a three-layered structure of Mo/Al/Mo. Components of the second gate layer GTL2 may be simultaneously formed of the same material and have the same layer structure.

An impurity may be added to a portion of the second active layer ATL2 shown in FIG. 11D, wherein the portion does not overlap the second gate layer GTL2. That is, a portion of the second active layer ATL2, the portion not overlapping the second gate layer GTL2, may be a doped portion. Accordingly, electrical characteristics of the portion of the second active layer ATL2, the portion not overlapping the second gate layer GTL2, may be different from electrical characteristics of a portion of the second active layer ATL2 overlapping the second gate layer GTL2.

A first interlayer insulating layer 116 (refer to FIG. 12) may cover the second gate layer GTL2, and may be positioned on the third gate insulating layer 114. The first interlayer insulating layer 116 may include an inorganic insulating material, such as silicon oxide, silicon nitride, silicon oxynitride, aluminum oxide, or the like. Like the third gate insulating layer 114 or the like, the first interlayer insulating layer 116 includes an inorganic insulating material, but the first interlayer insulating layer 116 is formed thicker than the third gate insulating layer 114 or the like, and thus components positioned below the first interlayer insulating layer 116 may be less affected. Accordingly, an upper surface of the first interlayer insulating layer 116 may have relatively less curvature compared to an upper surface of the third gate insulating layer 114 or the like. In FIG. 12, the upper surface of the first interlayer insulating layer 116 is shown as being flat, but this is shown as such for convenience, and the upper surface of the first interlayer insulating layer 116 may also not be flat.

Figure 11E:
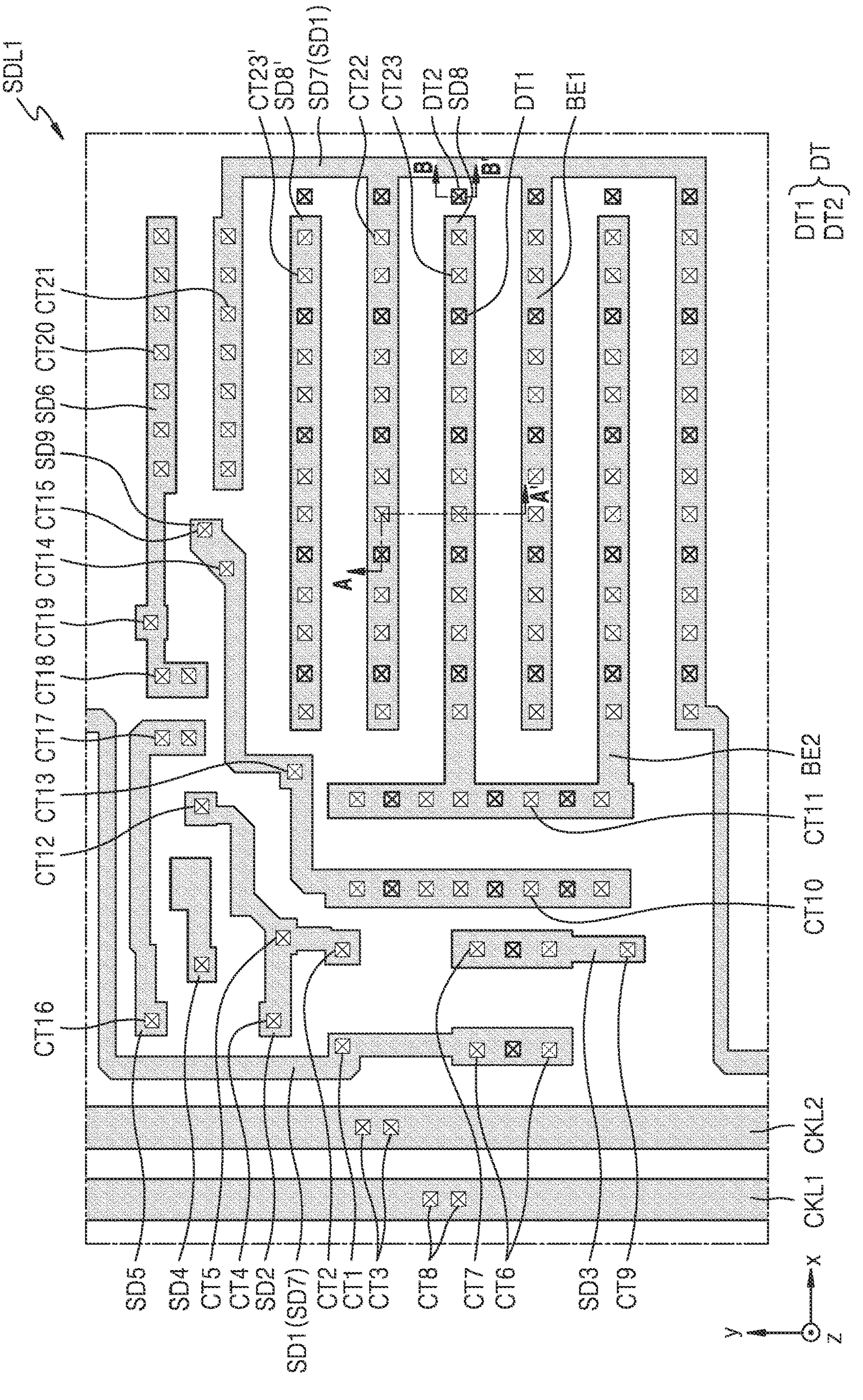

The first source drain layer SDL1 shown in FIG. 11E may be on the first interlayer insulating layer 116. The first source drain layer SDL1 may include a first source drain SD1, a second source drain SD2, a third source drain SD3, a fourth source drain SD4, a fifth source drain SD5, a sixth source drain SD6, a seventh source drain SD7, an eighth source drain SD8, a ninth source drain SD9, a first clock line CKL1, and a second clock line CKL2. For reference, FIG. 11E shows contact holes and dummy holes DT, which penetrate at least some of insulating layers disposed below the first source drain layer SDL1.

The first source drain SD1 may be electrically connected to the first sub active layer AT1 through a first contact hole CT1, and may be electrically connected to the fifth sub active layer AT5 through a sixth contact hole CT6. That is, the first source drain SD1 may be the first second electrode of the first substitute transistor T1' and the first electrode of the second substitute transistor T2' at the same time.

The second clock line CKL2 may be electrically connected to the first gate GT1 through a third contact hole CT3, and may apply a second clock signal to the first gate GT1, which is the gate electrode of the first substitute transistor T1'.

The second source drain SD2 may be electrically connected to the first sub active layer AT1 through a second contact hole CT2, and may be electrically connected to the second sub active layer AT2 through a fourth contact hole CT4. That is, the second source drain SD2 may be the second electrode of the first substitute transistor T1' and the second electrode of the ninth transistor T9 at the same time. In addition, the second source drain SD2 may be electrically connected to the third gate GT3, which is the gate electrode of the twelfth transistor T12 and the second electrode of the first capacitor C1 at the same time, through a fifth contact hole CT5 to form the second node Q. The second source drain SD2 may also be electrically connected to the seventh gate GT7, which is the gate electrode of the thirteenth transistor T13, through a twelfth contact hole CT12.

The fourth source drain SD4 may be electrically connected to the second gate GT2, which is the gate electrode of the ninth transistor T9, through a contact hole to electrically connect an initialization signal line SESRL (refer to FIG. 11F) to be described below to the second gate GT2.

The fifth source drain SD5 may be electrically connected to the second sub active layer AT2 through a sixteenth contact hole CT16, and may be electrically connected to the eighth sub active layer AT8, which is the first electrode of the first capacitor C1, through a seventeenth contact hole CT17. That is, the fifth source drain SD5 may be electrically connected to the first electrode of the first capacitor C1 as the first electrode of the ninth transistor T9.

The sixth source drain SD6 may be electrically connected to the eighth sub active layer AT8, which is the first electrode of the first capacitor C1, through an eighteenth contact hole CT18, may be electrically connected to the third sub active layer AT3 through a nineteenth contact hole CT19, and may be electrically connected to the fourth sub active layer AT4 through a twentieth contact hole CT20. That is, the sixth source drain SD6 may be the first electrode of the twelfth transistor T12 and the first electrode of the fourteenth transistor T14 at the same time.

The seventh source drain SD7 may be electrically connected to the fourth sub active layer AT4 through a twenty-first contact hole CT21, and may be electrically connected to the seventh sub active layer AT7 through a twenty-second contact hole CT22. In other words, the seventh source drain SD7 may be the second electrode of the fourteenth transistor T14 and the first electrode of the fifteenth transistor T15 at the same time. In addition, the seventh source drain SD7 is the output terminal 201 (refer to FIG. 4), and the output terminal 201 is electrically connected to the first input terminal 101 of a next stage, so the seventh source drain SD7 may be the first source drain SD1 of the next stage. Similarly, the first source drain SD1 shown in FIG. 11E may be the seventh source drain SD7 of a previous stage.

The eighth gate GT8, which is the gate electrode of the fifteenth transistor T15 described above with reference to FIG. 11D, may be arranged to correspond between the through holes TH of the seventh sub active layer AT7, and may have branch electrodes BE extending in the first direction (e.g., the x direction). In a plan view, the seventh source drain SD7 may be positioned between the branch electrodes BE of the eighth gate GT8 described above, and may have first branch electrodes BE1 electrically connected to each other. The first branch electrodes BE1 may be integrated with each other, as shown in FIG. 11E.

The eighth source drain SD8 may be electrically connected to the sixth sub active layer AT6 through an eleventh contact hole CT11, and may be electrically connected to the seventh sub active layer AT7 through a twenty-third contact hole CT23. That is, the eighth source drain SD8 may be the second electrode of the thirteenth transistor T13 and the second electrode of the fifteenth transistor T15 at the same time.

In a plan view, the eighth source drain SD8 may be positioned between the branch electrodes BE of the eighth gate GT8 described above, and may have second branch electrodes BE2 electrically connected to each other. The second branch electrodes BE2 may be spaced apart from the first branch electrodes BE1. The second branch electrodes BE2 may be integrated with each other, as shown in FIG. 11E.

Also, FIG. 11E shows an addition eighth source drain SD8' positioned apart from the eighth source drain SD8. Because the addition eighth source drain SD8' is electrically connected to the eighth source drain SD8 by a low voltage line VGLL (refer to FIG. 11F), the addition eighth source drain SD8' may function in the same way as the eighth source drain SD8. However, the disclosure is not limited thereto, and when a layout is changed, the addition eighth source drain SD8' and the eighth source drain SD8 may be integrated with each other, and the addition eighth source drain SD8' may be one of second branch electrodes BE2 included in the eighth source drain SD8.

The ninth source drain SD9 may be electrically connected to the sixth sub active layer AT6 through a tenth contact hole CT10, may be electrically connected to the eighth gate GT8, which is the gate electrode of the fifteenth transistor T15, through a thirteenth contact hole CT13, may be electrically connected to the third sub active layer AT3 through a fourteenth contact hole CT14, and may be electrically connected to the fourth gate GT4, which is the gate electrode of the fourteenth transistor T14, through a fifteenth contact hole CT15. That is, the ninth source drain SD9 may be the first electrode of the thirteenth transistor T13 while being the second electrode of the twelfth transistor T12.

The first clock line CKL1 may be electrically connected to the sixth gate GT6, which is the gate electrode of the second substitute transistor T2', through an eighth contact hole CT8 to apply the first clock signal CK1 to the sixth gate GT6.

Referring to FIG. 11E, the first source drain SD1, the third source drain SD3, the seventh source drain SD7, the eighth source drain SD8, and the ninth source drain SD9 may overlap the dummy holes DT. The first source drain SD1, the third source drain SD3, the seventh source drain SD7, the eighth source drain SD8, and the ninth source drain SD9 may be in contact with the dummy active layers DAT through the dummy holes DT. Each of the dummy holes DT may overlap a corresponding one of the dummy active layers DAT. In a plan view, the dummy holes DT may be spaced apart from the first to fourth sub active layers AT1, AT2, AT3, and AT4 of the first active layer ATL1 and the second active layer ATL2. Each of the dummy holes DT may be arranged adjacent to at least a portion of the second active layer ATL2. For example, each of the dummy holes DT may be arranged adjacent to one of the fifth sub active layer AT5 of the second substitute transistor T2', the sixth sub active layer AT6 of the thirteenth transistor T13, and the seventh sub active layer AT7 of the fifteenth transistor T15.

Hydrogen generated during an operation of manufacturing a display apparatus may act as a carrier when absorbed into an oxide semiconductor layer, and characteristics of a transistor including the oxide semiconductor layer may change depending on a degree of introduction of hydrogen. However, the dummy holes DT may outgas hydrogen, which may affect the characteristics of the oxide semiconductor layer, to the outside. In embodiments of the disclosure, characteristics of transistors including the second active layer ATL2 may be improved by including the dummy holes DT adjacent to the second active layer ATL2 including an oxide semiconductor. For example, the characteristics of the fifteenth transistor T15 may be improved by including the dummy holes DT adjacent to the seventh sub active layer AT7.

The first source drain layer SDL1 may include a metal, an alloy, a conductive metal oxide, a transparent conductive material, or the like. For example, the first source drain layer SDL1 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The first source drain layer SDL1 may have a multi-layered structure. For example, the first source drain layer SDL1 may have a two-layered structure of Ti/Al or a three-layered structure of Ti/Al/Ti. Components of the first source drain SD1 may be simultaneously formed of the same material and have the same layer structure.

A second interlayer insulating layer 117 (refer to FIG. 12) may cover the first source drain layer SDL1, and may be positioned on the first interlayer insulating layer 116. The second interlayer insulating layer 117 may include an inorganic insulating material, such as silicon oxide, silicon nitride, silicon oxynitride, aluminum oxide, or the like. Alternatively, the second interlayer insulating layer 117 may also include an organic insulating material, such as a photoresist, benzocyclobutene (BCB), polyimide, hexamethyldisiloxane (HMDSO), polymethyl methacrylate (PMMA), polystyrene, a polymer derivative containing a phenol group, an acrylic-based polymer, an imide-based polymer, an aryl ether-based polymer, an amide-based polymer, a fluorine-based polymer, a p-xylene-based polymer, a vinyl alcohol-based polymer, or a mixture thereof.

Figure 11F:
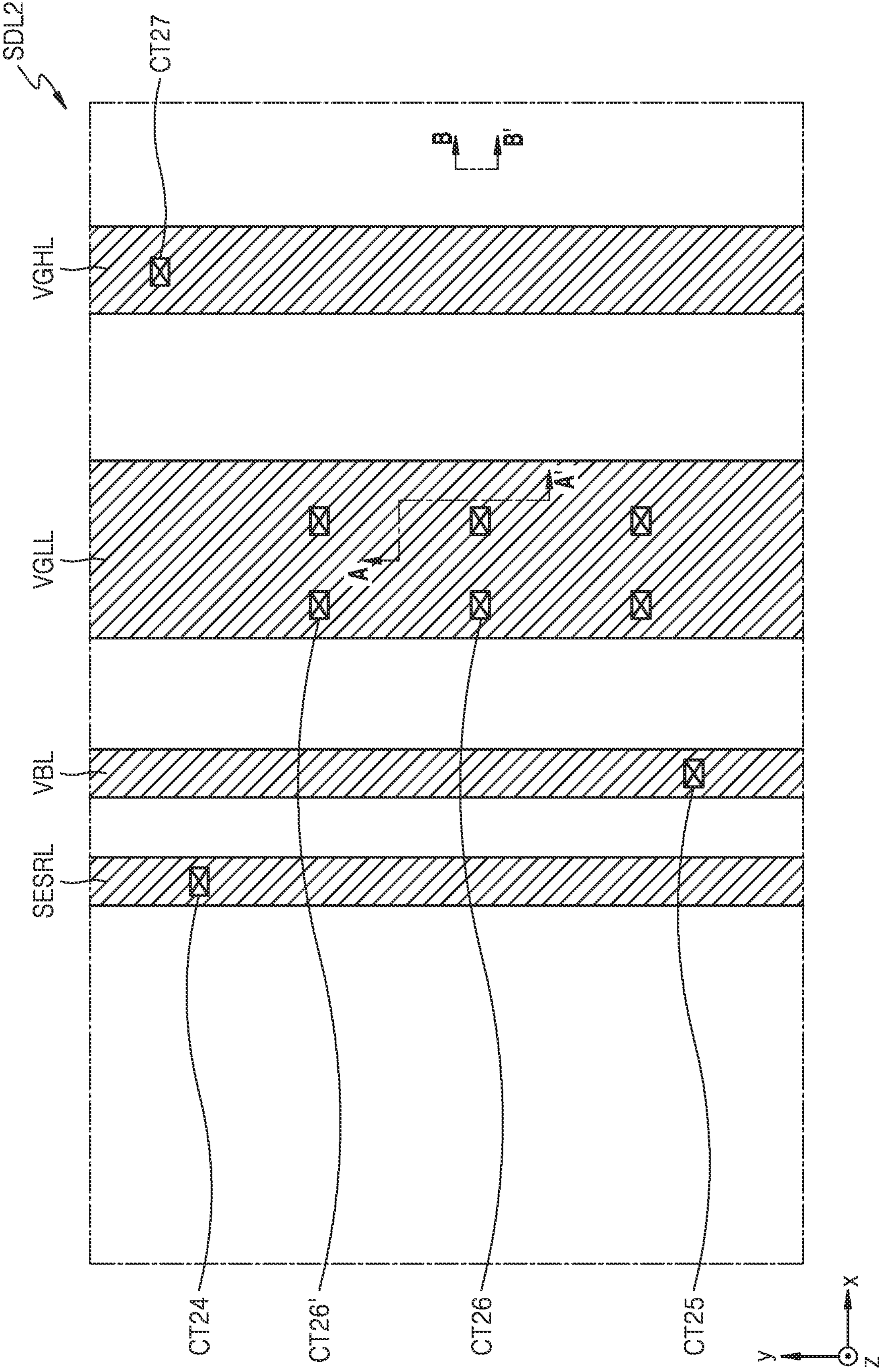

A second source drain layer SDL2 shown in FIG. 11F may be on the second interlayer insulating layer 117. The second source drain layer SDL2 may include the initialization signal line SESRL, a bias voltage line VBL, the low voltage line VGLL, and a high voltage line VGHL.

The initialization signal line SESRL may be electrically connected to the fourth source drain SD4 through a twenty-fourth contact hole CT24, and as a result, may be electrically connected to the second gate GT2, which is the gate electrode of the ninth transistor T9. Accordingly, the initialization signal line SESRL may apply an initialization signal to the gate electrode of the ninth transistor T9.

The bias voltage line VBL may be electrically connected to the fifth gate GT5 through a twenty-fifth contact hole CT25 to supply the bias voltage Vbias to back gate electrodes of the second substitute transistor T2', the thirteenth transistor T13, and the fifteenth transistor T15.

The low voltage line VGLL may be electrically connected to the eighth source drain SD8 through a twenty-sixth contact hole CT26 to apply a voltage at the low level VGL to the second electrode of the fifteenth transistor T15 and the second electrode of the thirteenth transistor T13. Also, the low voltage line VGLL may be electrically connected to the addition eighth source drain SD8' through an additional twenty-sixth contact hole CT26' to electrically connect the addition eighth source drain SD8' and the eighth source drain SD8 to each other.

The high voltage line VGHL may be electrically connected to the sixth source drain SD6 through a twenty-seventh contact hole CT27 to apply a voltage at the high level VGH to the first electrode of the fourteenth transistor T14, the first electrode of the twelfth transistor T12, the first electrode of the ninth transistor T9, and the second electrode of the first capacitor C1.

The second source drain layer SDL2 may include a metal, an alloy, a conductive metal oxide, a transparent conductive material, or the like. For example, the second source drain layer SDL2 may include Ag, an alloy containing Ag, Mo, an alloy containing Mo, Al, an alloy containing Al, AlN, W, WN, Cu, Ni, Cr, CrN, Ti, Ta, Pt, Sc, ITO, IZO, or the like. The second source drain layer SDL2 may have a multi-layered structure. For example, the second source drain layer SDL2 may have a two-layered structure of Ti/Al or a three-layered structure of Ti/Al/Ti. Components of the second source drain layer SDL2 may be simultaneously formed of the same material and have the same layer structure.

FIG. 12 is a cross-sectional view illustrating cross-sections respectively taken along a line A-A' and a line B-B' of FIG. 10, which shows the dummy holes DT adjacent to the seventh sub active layer AT7 of the fifteenth transistor T15.

Referring to FIG. 12, the dummy holes DT may be holes penetrating at least some of insulating layers. For example, the dummy holes DT may be holes penetrating an insulating between the first active layer ATL1 and the second active layer ATL2 and an insulating on the second active layer ATL2. For example, the dummy holes DT may be holes penetrating the first gate insulating layer 112, the second gate insulating layer 113, the third gate insulating layer 114, and the first interlayer insulating layer 116. As the dummy holes DT may be formed to penetrate an insulating layer between the first active layer ATL1 and the second active layer ATL2 as well as an insulating layer on the second active layer ATL2, the dummy holes DT may efficiently perform outgassing hydrogen to the outside without being absorbed into the second active layer ATL2.

A vertical distance between a lower end of each of the dummy holes DT and the substrate 100 may be less than a vertical distance between a lower end of the twenty-second contact hole CT22 contacting the seventh source drain SD7 and the seventh sub active layer AT7 or the twenty-third contact hole CT23 contacting the eighth source drain SD8 and the seventh sub active layer AT7 and the substrate 100.

The dummy holes DT may be formed together in a process of forming at least some of the contact holes shown in FIG. 11E. For example, the dummy holes DT may be formed together in a process of forming contacting holes contacting the first source drain layer SDL1 and the first to fourth sub active layers AT1, AT2, AT3, and AT4 of the first active layer ATL1. That is, a separate process may not be involved in forming the dummy holes DT.

The dummy holes DT may be filled with a conductive material or an insulating material. For example, a dummy hole DT1 may be filled with a conductive material, and a dummy hole DT2 may be filled with an insulating material. For example, the dummy hole DT1 may be filled with the same material as that of the seventh source drain SD7. The dummy hole DT2 may be filled with the same material as that of the second interlayer insulating layer 117 disposed on the first interlayer insulating layer 116. However, the disclosure is not limited thereto, and in another embodiment, some of the dummy holes DT may be empty inside without being filled with any material.

Figure 13A:
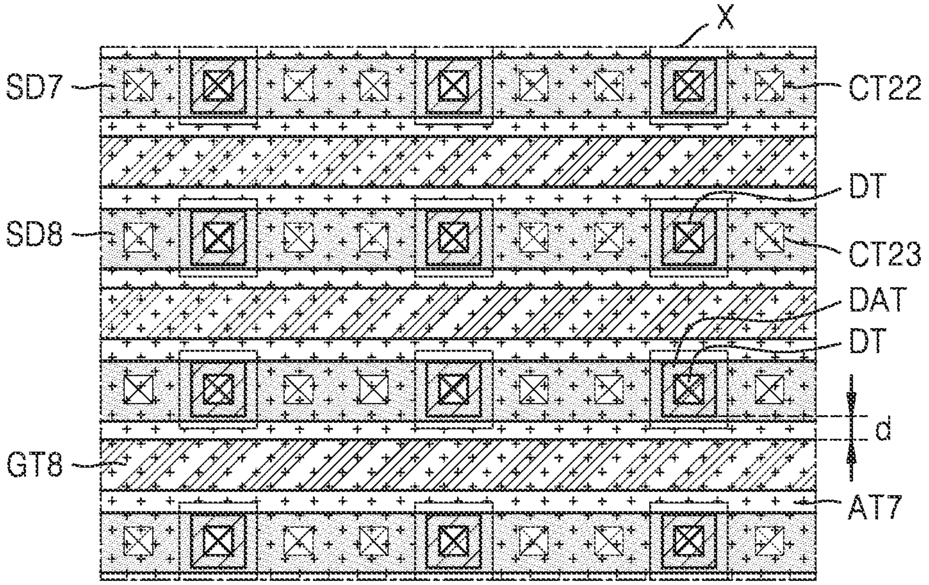
FIG. 13A is an enlarged view of some layers of FIG. 10.
Figure 13B:
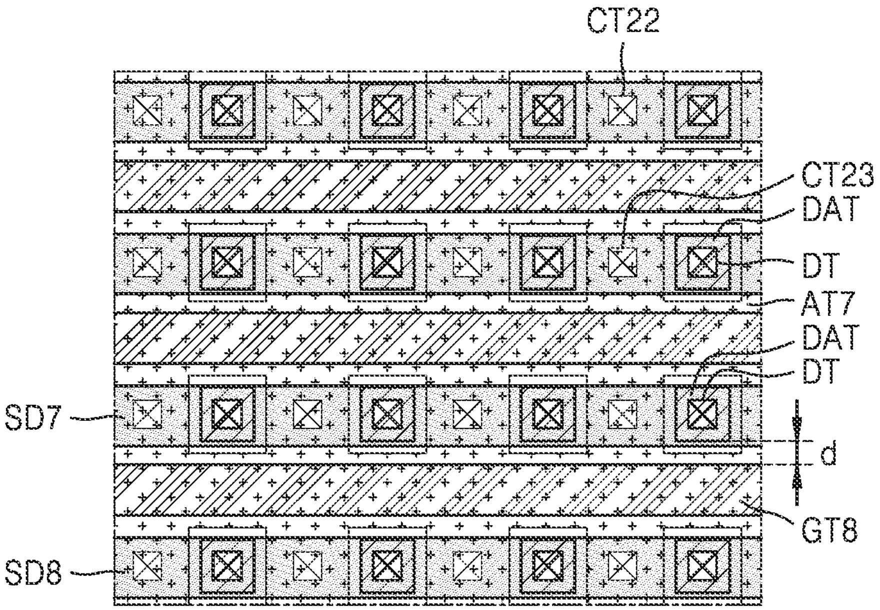
FIG. 13B is a diagram illustrating a modified example of FIG. 13A.

FIG. 13A is an enlarged view of a portion X of some layers of FIG. 10, and FIG. 13B shows a modified example of FIG. 13A. FIG. 13A shows the first active layer ATL1, the second active layer ATL2, the second gate layer GTL2, and the first source drain layer SDL1, which illustrates an enlarged view of a portion of the fifteenth transistor T15.

Referring to FIGS. 10, 11E, and 13A, the fifteenth transistor T15 includes the seventh sub active layer AT7, the eighth gate GT8 which is a gate electrode, the seventh source drain SD7, which is a first electrode, and the eighth source drain SD8 which is a second electrode. As described above, the seventh source drain SD7 and the eighth source drain SD8 may respectively include first branch electrodes BE1 and second branch electrodes BE2 between the branch electrodes of the eighth gate GT8, and the first branch electrodes BE1 of the seventh source drain SD7 and the second branch electrodes BE2 of the eighth source drain SD8 may overlap the contact holes and the dummy holes DT.

For example, the first branch electrodes BE1 of the seventh source drain SD7 may overlap the twenty-second contact holes CT22 contacting the seventh sub active layer AT7 and the dummy holes DT contacting the dummy active layers DAT. The twenty-second contact holes CT22 and the dummy holes DT overlapping each of the first branch electrodes BE1 may be arranged in an extension direction (e.g., the x direction) of the first branch electrodes BE1. The second branch electrodes BE2 of the eighth source drain SD8 may overlap the twenty-third contact holes CT23 contacting the seventh sub active layer AT7 and the dummy holes DT contacting the dummy active layers DAT. The twenty-third contact holes CT23 and the dummy holes DT overlapping each of the second branch electrodes BE2 may be arranged in an extension direction (e.g., the x direction) of the second branch electrodes BE2.

Referring to FIG. 13A, in a plan view, a shortest distance between the dummy holes DT and an adjacent second active layer ATL2 may be 10 μm or less. Preferably, in a plan view, a shortest distance between the dummy holes DT and an adjacent second active layer ATL2 may be 5 μm or less. More preferably, in a plan view, a shortest distance between the dummy holes DT and an adjacent second active layer ATL2 may be 2.5 μm or less. As a comparative example, when a shortest distance between dummy holes and a second active layer exceeds the above range by arranging the dummy holes without considering a distance to the second active layer, the dummy holes may not effectively prevent hydrogen from being absorbed into the second active layer. For example, as shown in FIG. 13A, a shortest distance d between the dummy holes DT and the seventh sub active layer AT7 may be 10 μm or less. Here, the shortest distance d between the dummy holes DT and the seventh sub active layer AT7 may mean a shortest distance between the dummy holes DT and the channel region of the seventh sub active layer AT7 overlapping the eighth gate GT8.

Referring to FIGS. 13A and 13B, the dummy holes DT may be arranged in a pattern having a certain rule in a plan view so that outgassing may be efficiently performed. For example, as shown in FIGS. 10 and 13A, the twenty-second contact holes CT22 and the dummy holes DT, which overlap any one of the first branch electrodes of the seventh source drain SD7, may be arranged according to a certain rule. For example, two twenty-second contact holes CT22 may be arranged to be positioned between adjacent dummy holes DT. The twenty-third contact holes CT23 and the dummy holes DT, which overlap any one of the second branch electrodes BE2 of the eighth source drain SD8, may be arranged to have a certain rule. For example, two twenty-third contact holes CT23 may be arranged to be positioned between adjacent dummy holes DT. However, the disclosure is not limited thereto. Referring to FIG. 13B, for example, in another embodiment, the twenty-second contact holes CT22 and the dummy holes DT, which overlap any one of the first branch electrodes of the seventh source drain SD7, may be alternately arranged. The twenty-third contact holes CT23 and the dummy holes DT, which overlap any one of the second branch electrodes BE2 of the eighth source drain SD8, may be alternately arranged.

Figure 14:
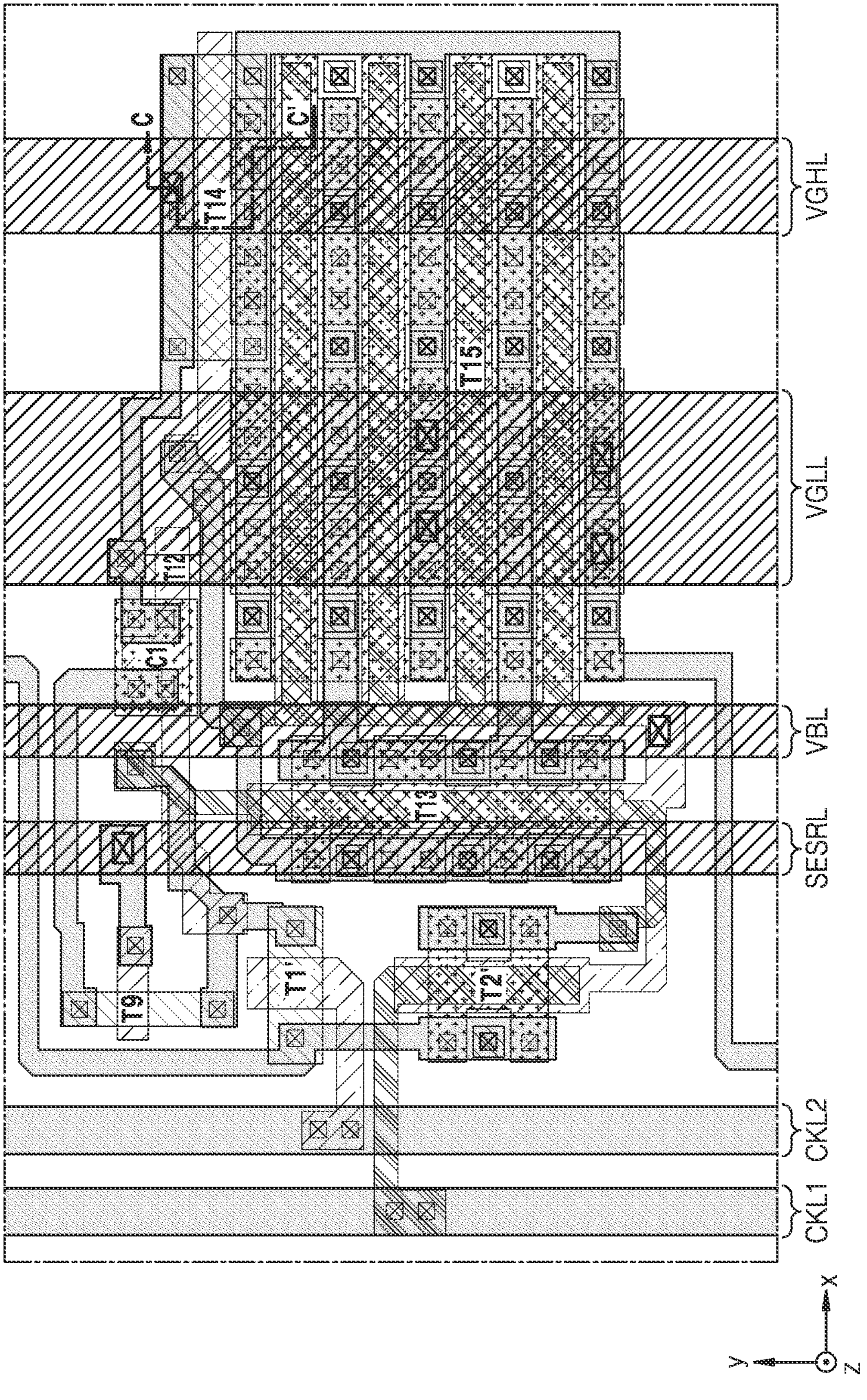
FIG. 14 is a layout view schematically illustrating positions of transistors and capacitors included in a stage of a scan driver of a display apparatus according to another embodiment.

FIG. 14 is a layout view schematically illustrating positions of transistors and capacitors included in a stage of a scan driver of a display apparatus according to another embodiment, schematically illustrating positions of the transistors T1', T2', T9, T12, T13, T14, and T15 and the first capacitor C1 included in the stage of FIG. 9. FIGS. 15A to 15F are layout views schematically illustrating components such as transistors T1', T2', T9, T12, T13, T14, and T15 and the first capacitor C1 shown in FIG. 14 for each layer, and FIG. 16 is a cross-sectional view illustrating a cross section taken along a line C-C' of FIG. 14. FIGS. 14 to 16 are different from the embodiments of FIGS. 10 to 12 in the configurations of the fourteenth transistor T14 and the fifteenth transistor T15. Hereinafter, differences from the embodiments of FIGS. 10 to 12 are mainly described, and redundant descriptions are omitted.

The display apparatus 9 may the substrate 100 (refer to FIG. 16), and various components, such as the transistors T1', T2', T9, T12, T13, T14, and T15 and the first capacitor C1, included in a stage of a scan driver may be positioned on the substrate 100. The first substitute transistor T1', the ninth transistor T9, the twelfth transistor T12, and the fourteenth transistor T14 may be p-type transistors, and the second substitute transistor T2', the thirteenth transistor T13, and the fifteenth transistor T15 may be n-type transistors.

Figure 15A:
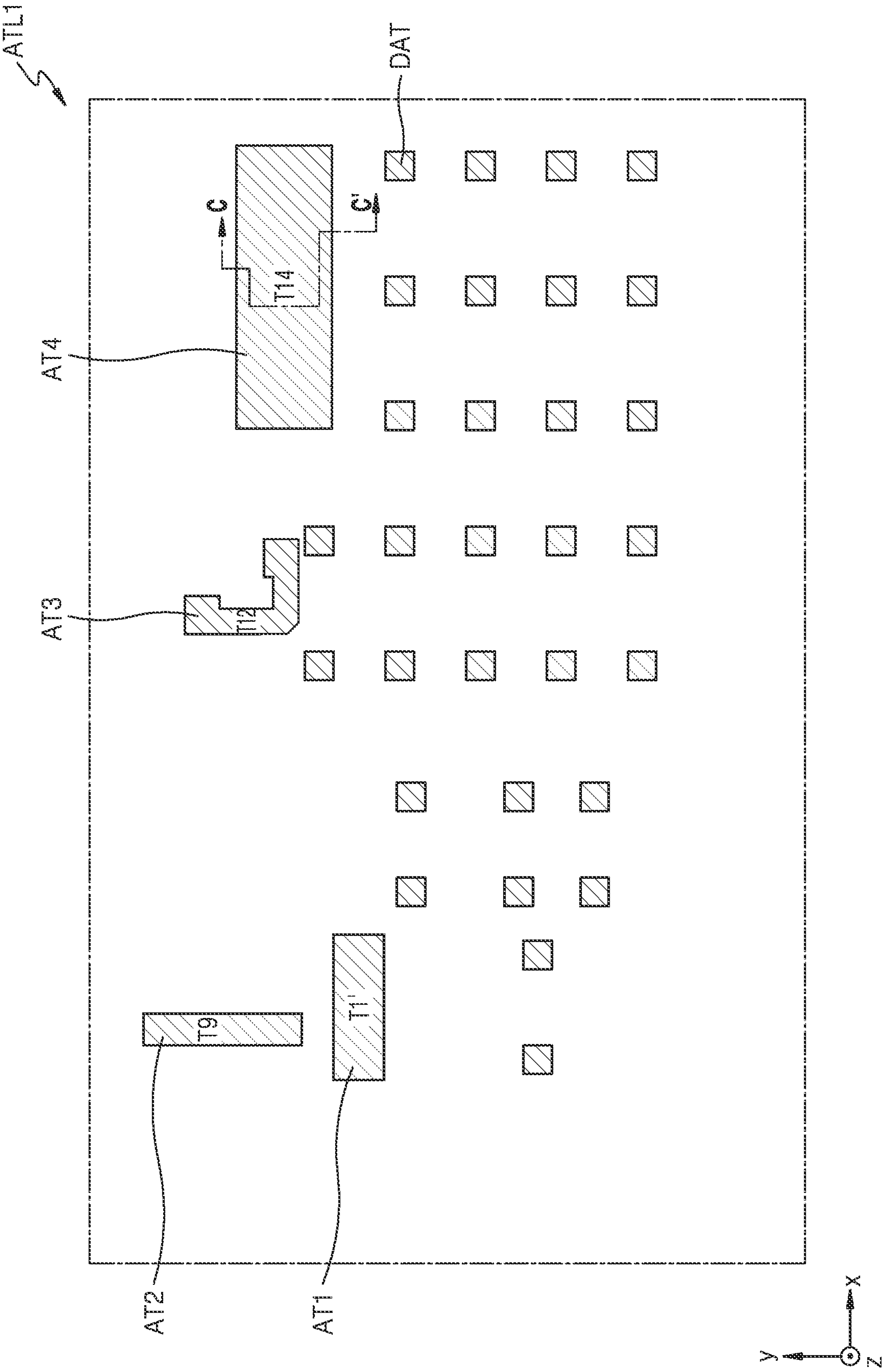
FIGS. 15A, 15B, 15C, 15D, 15E, and 15F are layout views schematically illustrating components such as transistors and capacitors shown in FIG. 14 for each layer.
Figure 16:
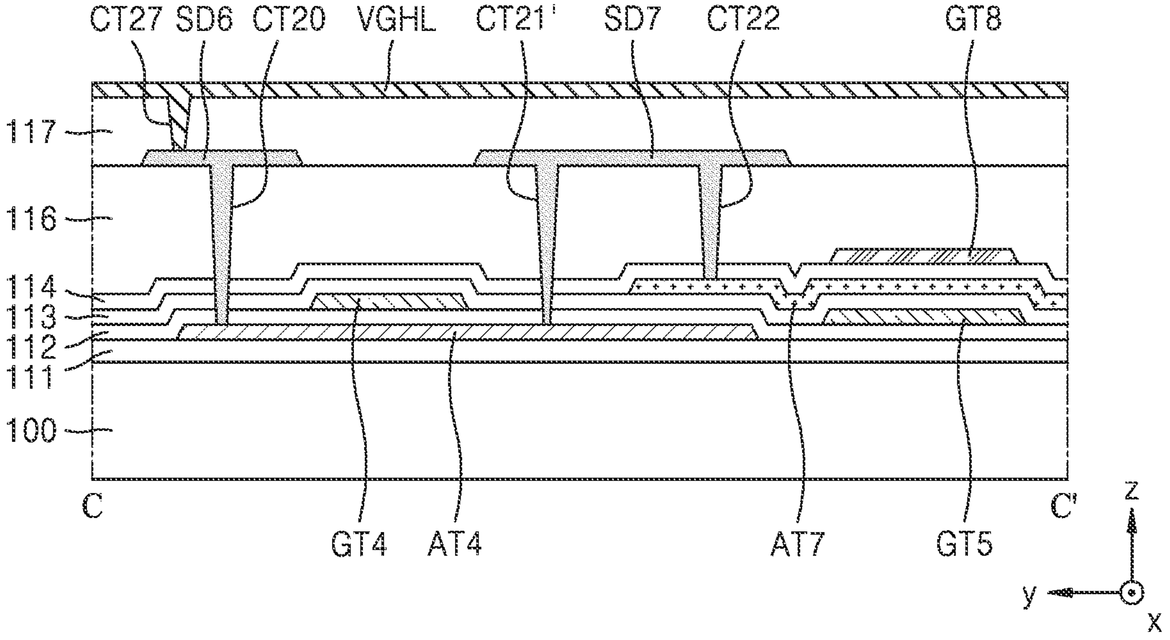
FIG. 16 is a cross-sectional view illustrating a cross section taken along a line C-C' of FIG. 14.

The buffer layer 111 may be disposed on the substrate 100, the first active layer ATL1 shown in FIG. 15A may be disposed on the buffer layer 111. The first active layer ATL1 may include a silicon semiconductor. The first active layer ATL1 may include a first sub active layer AT1, a second sub active layer AT2, a third sub active layer AT3, a fourth sub active layer AT4, and dummy active layers DAT.

The first gate insulating layer 112 (refer to FIG. 16) may cover the first active layer ATL1, and may be disposed on the buffer layer 111.

Figure 15B:
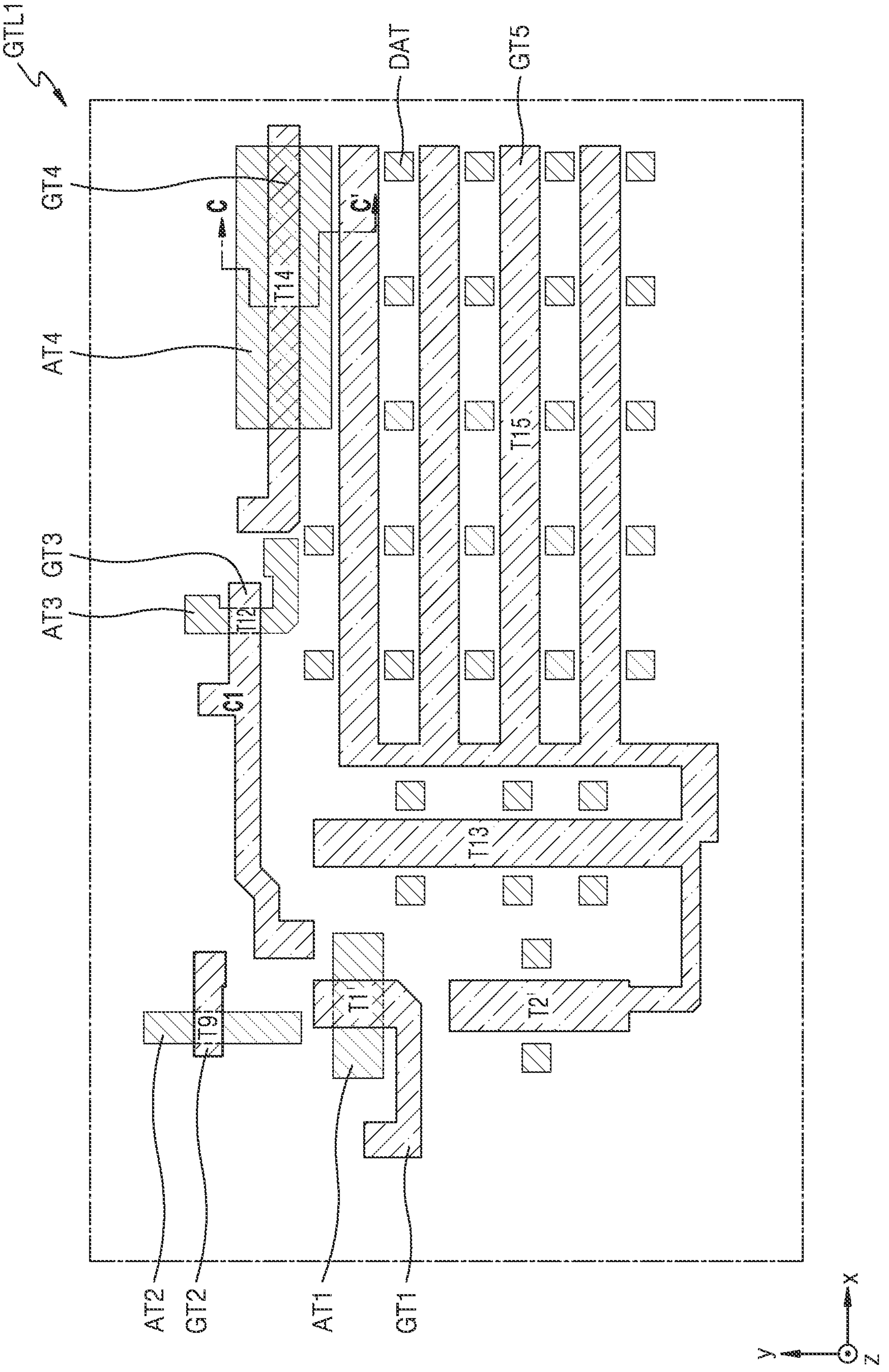

The first gate layer GTL1 shown in FIG. 15B may be on the first gate insulating layer 112. The first gate layer GTL1 may include the first gate GT1, the second gate GT2, the third gate GT3, the fourth gate GT4, and the fifth gate GT5, which are spaced apart from each other. The fourth gate GT4 may function as a gate electrode of the fourteenth transistor T14 by overlapping a channel region of the fourth sub active layer AT4. A portion of the fifth gate GT5 may be positioned below the gate electrode of the fifteenth transistor T15 and may function as a back gate electrode of the fifteenth transistor T15. The fifth gate GT5 integrally has a shape passing between the dummy active layers DAT. A portion of the fifth gate GT5 may be positioned between some of the dummy active layers DAT and the fourth sub active layer AT4.

The second gate insulating layer 113 (refer to FIG. 16) may cover the first gate layer GTL1, and may be positioned on the first gate insulating layer 112.

Figure 15C:
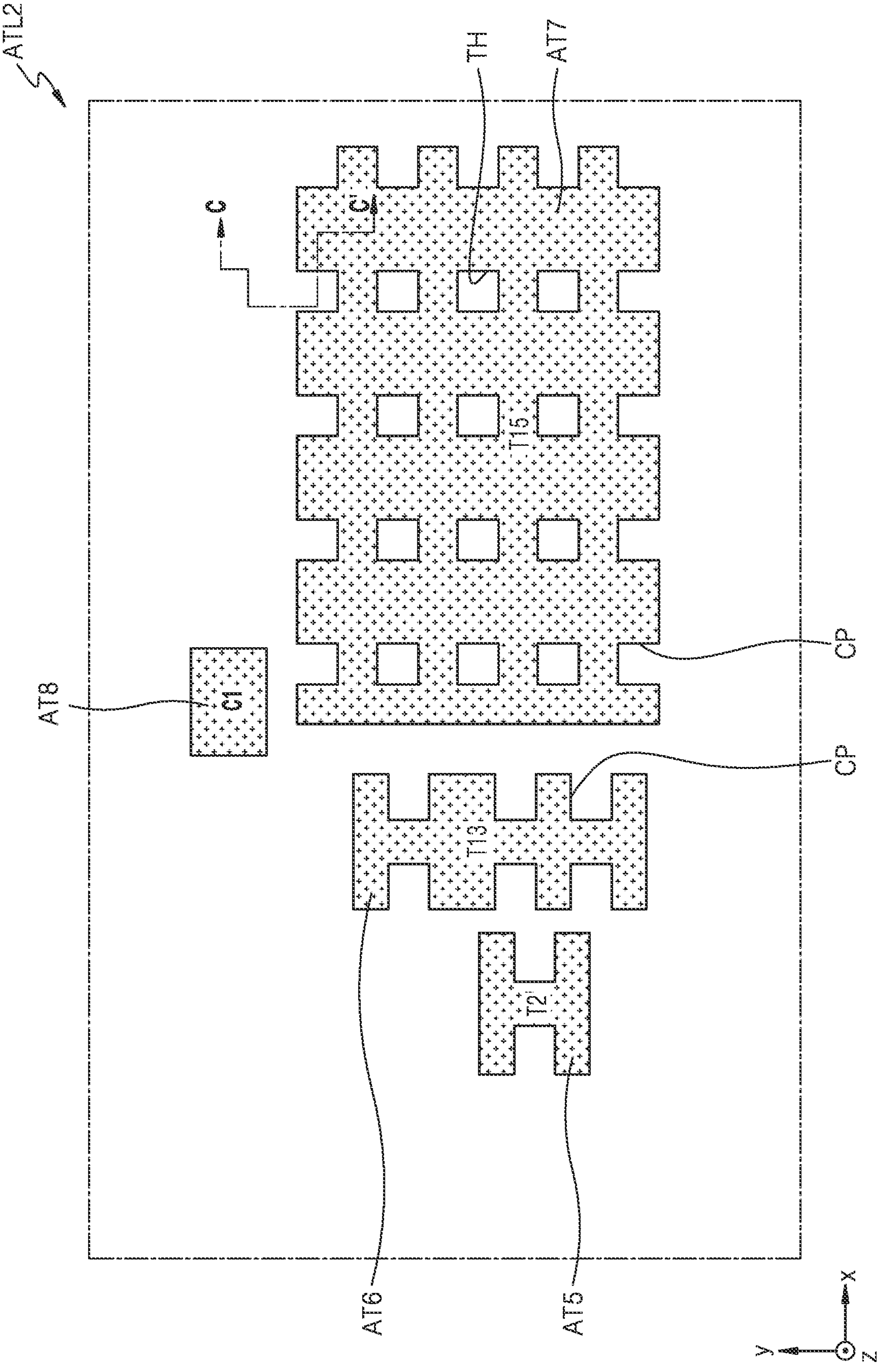

The second active layer ATL2 as shown in FIG. 15C may be disposed on the second gate insulating layer 113. The second active layer ATL2 may include an oxide semiconductor. The second active layer ATL2 may include the fifth sub active layer AT5, the sixth sub active layer AT6, the seventh sub active layer AT7, and the eighth sub active layer AT8.

In a plan view, the seventh sub active layer AT7 may have a plurality of concave portion on the outside. Also, the seventh sub active layer AT7 may have a plurality of through holes. Some of the dummy active layers DAT may correspond to the through holes of the seventh sub active layer AT7. Each of some of the dummy active layers DAT may be positioned in a corresponding one of the through holes. Also, some other of the dummy active layers DAT may correspond to the concave portions of the seventh sub active layer AT7. Each of the some other of the dummy active layers DAT may be positioned in a corresponding one of the concave portions of the seventh sub active layer AT7.

The second active layer ATL2 may at least partially overlap the first active layer ATL1. For example, the seventh sub active layer AT7 may at least partially overlap the fourth sub active layer AT4. The fourth sub active layer AT4 may overlap concave portions of the seventh sub active layer AT7, which do not correspond to the dummy active layers DAT.

In an embodiment, a first semiconductor layer in claims may be the seventh sub active layer AT7, and a second semiconductor layer in claims may be the fourth sub active layer AT4. A dummy semiconductor layer in claims may be the dummy active layer DAT.

The third gate insulating layer 114 (refer to FIG. 16) may cover the second active layer ATL2, and may be disposed on the second gate insulating layer 113.

Figure 15D:
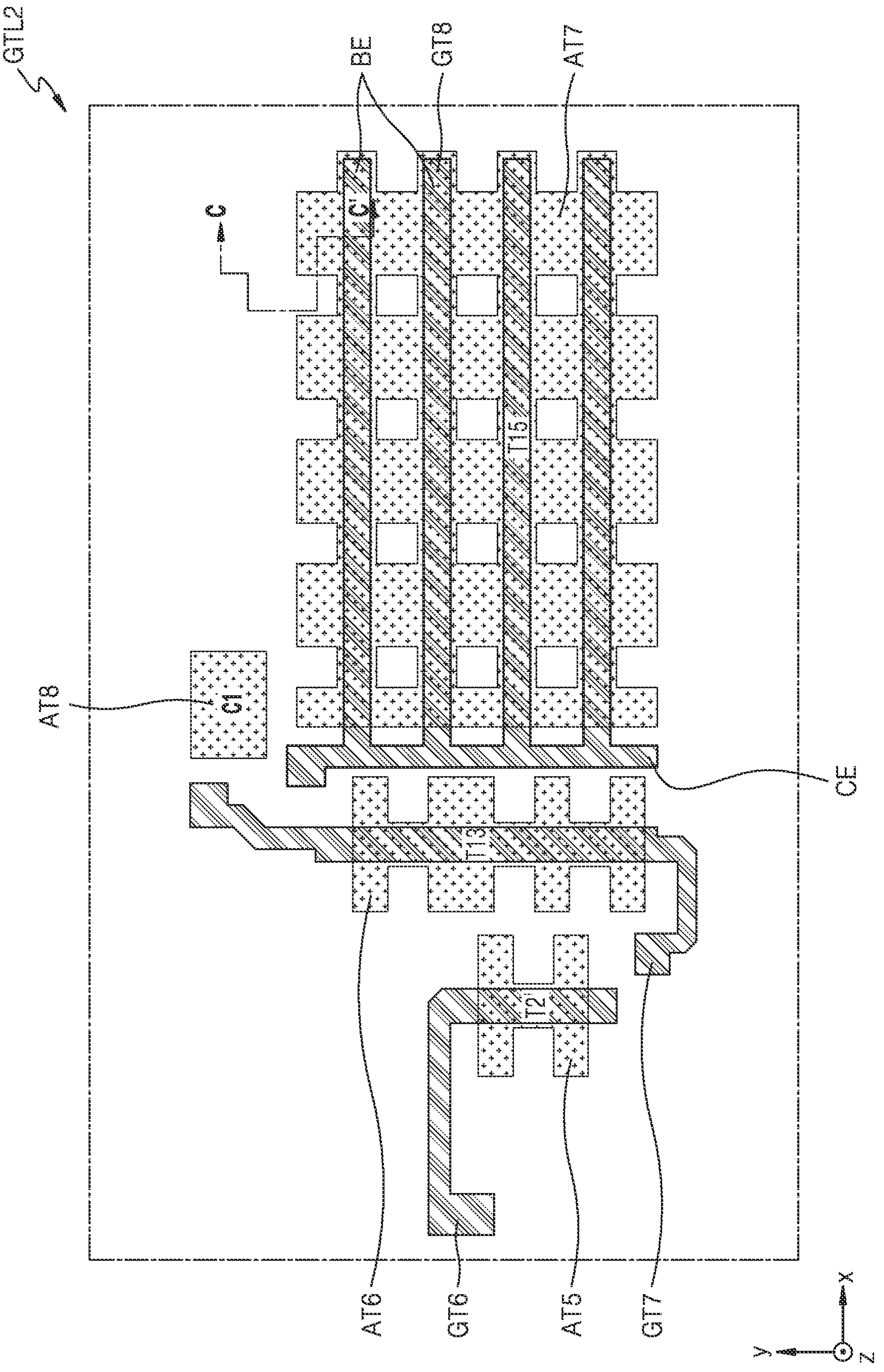

The second gate layer GTL2 as shown in FIG. 15D may be on the third gate insulating layer 114. The second gate layer GTL2 may include a sixth gate GT6, a seventh gate GT7, and an eighth gate GT8, which are spaced apart from each other. The eighth gate GT8 may function as the gate electrode of the fifteenth transistor T15 by overlapping a channel region of the seventh sub active layer AT7.

The eighth gate GT8 may include a plurality of branch electrodes extending in a first direction (e.g., the x direction). The plurality of branch electrodes may be positioned between through holes of the seventh sub active layer AT7. The plurality of branch electrodes may be electrically connected to each other by a connection electrode extending in a second direction (e.g., a y direction) crossing the first direction (e.g., the x direction). The branch electrodes of the eighth gate GT8 may be integrally provided with the contact electrode. One of the branch electrodes of the eighth gate GT8 may be spaced apart from the fourth sub active layer AT4 in a plan view, but may be arranged adjacent to the fourth sub active layer AT4.

The first interlayer insulating layer 116 (refer to FIG. 16) may cover the second gate layer GTL2, and may be positioned on the third gate insulating layer 114.

Figure 15E:
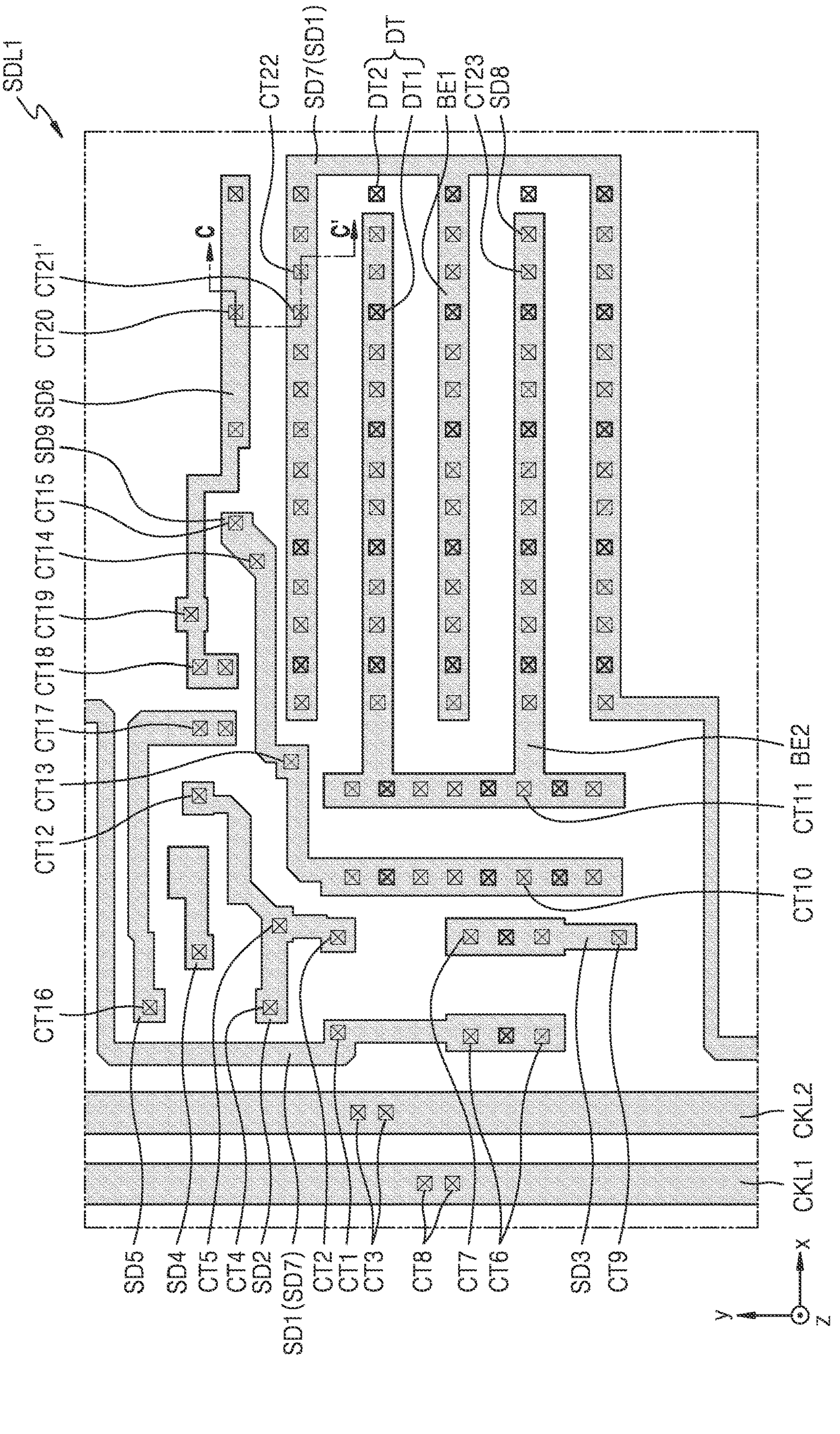
Figure 15F:
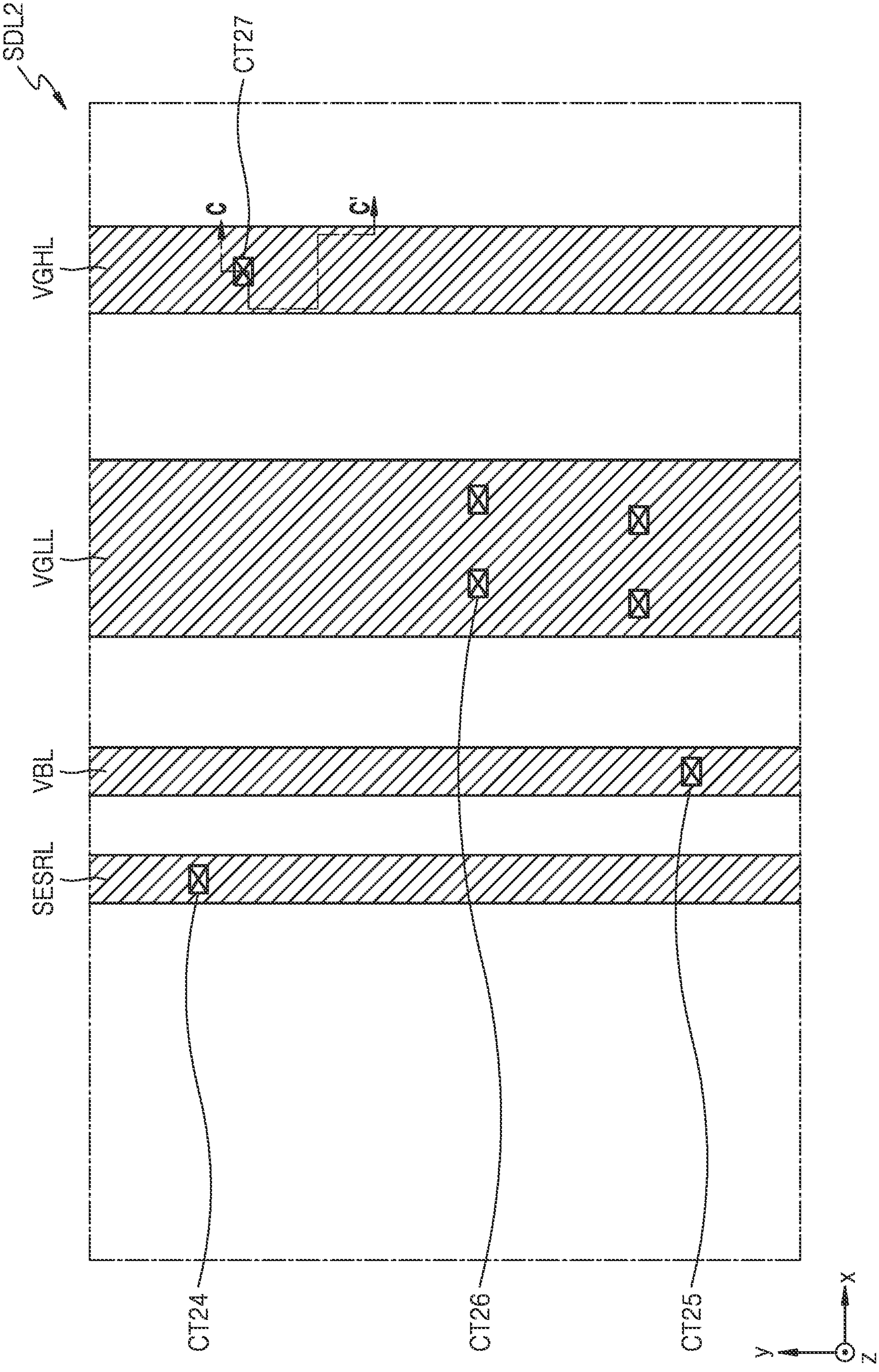

The first source drain layer SDL1 shown in FIG. 15E may be on the first interlayer insulating layer 116. The first source drain layer SDL1 may include the first source drain SD1, the second source drain SD2, the third source drain SD3, the fourth source drain SD4, the fifth source drain SD5, the sixth source drain SD6, the seventh source drain SD7, the eighth source drain SD8, the ninth source drain SD9, the first clock line CKL1, and the second clock line CKL2. FIG. 15E shows contact holes and the dummy holes DT, which penetrate at least some of insulating layers disposed below the first source drain layer SDL1.

The sixth source drain SD6 may be electrically connected to the fourth sub active layer AT4 through the twentieth contact hole CT20.

The seventh source drain SD7 may be electrically connected to the fourth sub active layer AT4 through a twenty-first contact hole CT21', and may be electrically connected to the seventh sub active layer AT7 through a twenty-second contact hole CT22.

In a plan view, the seventh source drain SD7 may be positioned between the branch electrodes of the eighth gate GT8 described above, and may have first branch electrodes BE1 electrically connected to each other. The first branch electrodes BE1 may be integral.

In a plan view, each of the first branch electrodes BE1 of the seventh source drain SD7 may overlap the contact holes and the dummy holes DT. Each of the first branch electrodes BE1 may overlap the twenty-second contact holes CT22 contacting the seventh sub active layer AT7 and the dummy holes DT contacting the dummy active layers DAT. In addition, one of the first branch electrodes BE1 of the seventh source drain SD7, for example, a first branch electrode on a side of the sixth source drain SD6, may overlap at least one twenty-first contact hole CT21' contacting the fourth sub active layer AT4. In a plan view, at least one twenty-first contact hole CT21' may overlap the fourth sub active layer AT4 and may be positioned in a corresponding one of the concave portions of the seventh sub active layer AT7.

The twenty-second contact holes CT22 overlapping one of the first branch electrodes BE1 of the seventh source drain SD7, for example, the first branch electrode positioned on the side of the sixth source drain SD6, the dummy holes DT, and at least one twenty-first contact hole CT21' may be arranged in the extension direction (e.g., the x direction) of the first branch electrode.

Referring to FIGS. 14 and 15E, in a plan view, a shortest distance between at least one twenty-first contact hole CT21' and the seventh sub active layer AT7 adjacent thereto may be 10 μm or less, preferably 5 μm or less, and more preferably 2.5 μm or less. Here, the shortest distance between the at least one twenty-first contact hole CT21' and the seventh sub active layer AT7 may mean a shortest distance between the channel region of the seventh sub active layer AT7 overlapping the eighth gate GT8 and the at least one twenty-first contact hole CT21'.

The at least one twenty-first contact hole CT21' overlapping the fourth sub active layer AT4 of the fourteenth transistor T14 may be arranged adjacent to the seventh sub active layer AT7 of the fifteenth transistor T15, and thus the at least one twenty-first contact hole CT21 may perform the same function as the dummy holes DT. That is, the at least one twenty-first contact hole CT21 may perform outgassing so that hydrogen generated during an operation of manufacturing a display apparatus is not absorbed into the second active layer ATL2, for example, the seventh sub active layer AT7.

The second interlayer insulating layer 117 (refer to FIG. 16) may cover the first source drain layer SDL1, and may be positioned on the first interlayer insulating layer 116.

The second source drain layer SDL2 shown in FIG. 15 may be on the second interlayer insulating layer 117. The second source drain layer SDL2 may include the initialization signal line SESRL, the bias voltage line VBL, the low voltage line VGLL, and the high voltage line VGHL.

The high voltage line VGHL may be electrically connected to the sixth source drain SD6 through a twenty-seventh contact hole CT27 to apply a voltage at the high level VGH to a first electrode of the fourteenth transistor T14.

According to the embodiments described above, a display apparatus capable of displaying high-quality images may be implemented. The scope of the disclosure is limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a substrate having a display area and a peripheral area outside the display area;

a transistor in the display area and a light-emitting element electrically connected to the transistor; and a scan driver in the peripheral area, wherein the scan driver comprises:

a first transistor disposed on the substrate and comprising a first semiconductor layer comprising an oxide semiconductor and a first gate electrode overlapping the first semiconductor layer;

a second transistor disposed on the substrate and comprising a second semiconductor layer comprising a silicon semiconductor and a second gate electrode overlapping the second semiconductor layer; and insulating layers disposed on the substrate and defining dummy holes not overlapping the first semiconductor layer and the second semiconductor layer, wherein the dummy holes are spaced apart from the first semiconductor layer and the second semiconductor layer and overlap dummy semiconductor layers adjacent to the first semiconductor layer, and wherein the first semiconductor layer is disposed on one of a plurality of insulating layers different from one of a plurality of insulating layers on which the second semiconductor layer is disposed.

2. The display apparatus of claim 1, wherein, in a plan view, a shortest distance between the dummy holes and the first semiconductor layer is 10 μm or less.

3. The display apparatus of claim 1, wherein, in a plan view, the first semiconductor layer comprises through holes, and the dummy semiconductor layers are respectively in the through holes of the first semiconductor layer.

4. The display apparatus of claim 3, wherein the first gate electrode comprises branch electrodes extending in a first direction and electrically connected to each other, and the branch electrodes are between the through holes of the first semiconductor layer.

5. The display apparatus of claim 4, wherein a gap between the branch electrodes is constant.

6. The display apparatus of claim 4, wherein widths of the branch electrodes in a second direction perpendicular to the first direction are equal to each other.

7. The display apparatus of claim 4, further comprising:

in a plan view, first branch electrodes positioned between the branch electrodes and electrically connected to each other; and second branch electrodes positioned between the branch electrodes to be spaced apart from the first branch electrodes and electrically connected to each other.

8. The display apparatus of claim 7, wherein each of the first branch electrodes is in contact with the first semiconductor layer through a first contact hole, and each of the second branch electrodes is in contact with the first semiconductor layer through a second contact hole.

9. The display apparatus of claim 8, wherein the first branch electrodes overlap some of the dummy holes, and the second branch electrodes overlap some other of the dummy holes.

10. The display apparatus of claim 9, wherein a plurality of first contact holes and a plurality of second contact holes are provided, in a plan view, the dummy holes overlapping any one of the first branch electrodes and the plurality of first contact holes are arranged in a direction in which the one first branch electrode extends, and the dummy holes overlapping any one of the second branch electrodes and the plurality of second contact holes are arranged in a direction in which the one second branch electrode extends.

11. The display apparatus of claim 10, wherein, in a plan view, the dummy holes overlapping any one of the first branch electrodes and the plurality of first contact holes are alternately arranged, and the dummy holes overlapping any one of the second branch electrodes and the plurality of second contact holes are alternately arranged.

12. The display apparatus of claim 8, wherein a vertical distance between a lower end of each of the dummy holes and the substrate is less than a vertical distance between a lower end of the first contact hole and the substrate or a vertical distance between a lower end of the second contact hole and the substrate.

13. The display apparatus of claim 7, wherein, in a plan view, the second semiconductor layer at least partially overlaps the first semiconductor layer.

14. The display apparatus of claim 13, wherein one of the first branch electrodes and the second branch electrodes is in contact with the second semiconductor layer through at least one third contact hole.

15. The display apparatus of claim 14, wherein, in a plan view, the first semiconductor layer comprises outer concave portions, and the at least one third contact hole is in the outer concave portions of the first semiconductor layer.

16. The display apparatus of claim 13, wherein, in a plan view, a shortest distance between the at least one third contact hole and the first semiconductor layer is 10 μm or less.

17. The display apparatus of claim 1, wherein the dummy semiconductor layers are disposed on a same layer as the second semiconductor layer and comprise a same material as a material of the second semiconductor layer.

18. The display apparatus of claim 1, wherein the insulating layers comprise a first insulating layer covering the second semiconductor layer and a second insulating layer disposed on the first insulating layer and covering the first semiconductor layer, and the dummy holes penetrate the first insulating layer and the second insulating layer.

19. The display apparatus of claim 1, wherein the dummy holes comprise a first dummy hole filled with a conductive material and a second dummy hole filled with an insulating material.

20. The display apparatus of claim 1, wherein the scan driver comprises a plurality of stages and has an output terminal electrically corresponding to a scan line corresponding to each of the plurality of stages, and the first transistor of the scan driver is electrically connected to the output terminal.

* * * * *